(12) United States Patent
Yamazaki

(10) Patent No.: US 9,293,544 B2
(45) Date of Patent: Mar. 22, 2016

(54) SEMICONDUCTOR DEVICE HAVING BURIED CHANNEL STRUCTURE

(71) Applicant: Semiconductor Energy Laboratory Co., Ltd., Atsugi-shi, Kanagawa-ken (JP)

(72) Inventor: Shunpei Yamazaki, Setagaya (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 0 days.

(21) Appl. No.: 14/185,208

(22) Filed: Feb. 20, 2014

(65) Prior Publication Data
US 2014/0239294 A1 Aug. 28, 2014

(30) Foreign Application Priority Data
Feb. 26, 2013 (JP) .................. 2013-035360

(51) Int. Cl.
*H01L 29/78* (2006.01)
*H01L 29/417* (2006.01)
*H01L 29/786* (2006.01)

(52) U.S. Cl.
CPC ...... *H01L 29/41733* (2013.01); *H01L 29/7869* (2013.01); *H01L 29/78696* (2013.01)

(58) Field of Classification Search
CPC ....... H01L 29/78; H01L 21/336; H01L 29/24; H01L 29/045; H01L 29/267; H01L 29/66; H01L 27/146; H01L 27/15; H01L 27/32; H01L 29/786
See application file for complete search history.

(56) References Cited

U.S. PATENT DOCUMENTS

| 5,731,856 A | 3/1998 | Kim et al. |
| 5,744,864 A | 4/1998 | Cillessen et al. |

(Continued)

FOREIGN PATENT DOCUMENTS

| EP | 1737044 A | 12/2006 |
| EP | 2226847 A | 9/2010 |

(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

(Continued)

*Primary Examiner* — Selim Ahmed
(74) *Attorney, Agent, or Firm* — Robinson Intellectual Property Law Office; Eric J. Robinson

(57) ABSTRACT

A semiconductor device that includes an oxide semiconductor and is suitable for a power device having an ability to allow large current to flow therein. The semiconductor device includes: a first electrode having an opening and a second electrode provided in the opening of the first electrode and separated from the first electrode, over the semiconductor layer; a gate insulating layer over the first electrode, the second electrode, and the semiconductor layer; and a ring-shaped gate electrode over the gate insulating layer. An inner edge portion of the ring-shaped gate electrode overlaps the second electrode, while an outer edge portion of the ring-shaped gate electrode overlaps a part of the oxide semiconductor layer, which is located between the first electrode and the second electrode. An element imparting conductivity to the oxide semiconductor layer is added to the part.

7 Claims, 21 Drawing Sheets

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,601,984 B2 | 10/2009 | Sano et al. |
| 7,674,650 B2 | 3/2010 | Akimoto et al. |
| 7,732,819 B2 | 6/2010 | Akimoto et al. |
| 7,994,500 B2 | 8/2011 | Kim et al. |
| 8,058,645 B2 | 11/2011 | Jeong et al. |
| 8,148,779 B2 | 4/2012 | Jeong et al. |
| 8,188,480 B2 | 5/2012 | Itai |
| 8,202,365 B2 | 6/2012 | Umeda et al. |
| 8,203,143 B2 | 6/2012 | Imai |
| 8,344,788 B2 | 1/2013 | Yamazaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0320458 A1 | 12/2010 | Umeda et al. |
| 2010/0320459 A1 | 12/2010 | Umeda et al. |
| 2011/0068852 A1 | 3/2011 | Yamazaki et al. |
| 2011/0140100 A1* | 6/2011 | Takata et al. ............ 257/43 |
| 2011/0193083 A1 | 8/2011 | Kim et al. |
| 2011/0215328 A1 | 9/2011 | Morosawa et al. |
| 2012/0119205 A1 | 5/2012 | Taniguchi et al. |
| 2012/0319183 A1* | 12/2012 | Yamazaki et al. ............ 257/288 |
| 2013/0119378 A1 | 5/2013 | Yamazaki et al. |
| 2014/0225104 A1 | 8/2014 | Yamazaki et al. |
| 2014/0239293 A1 | 8/2014 | Yamazaki et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2009-231613 | 10/2009 |
| JP | 2010-016347 | 1/2010 |
| JP | 4415062 | 2/2010 |
| JP | 2010-067954 | 3/2010 |
| JP | 2010-177431 | 8/2010 |
| JP | 4571221 | 10/2010 |
| JP | 2011-091382 | 5/2011 |
| JP | 2011-172217 | 9/2011 |
| JP | 2012-160679 | 8/2012 |
| WO | WO-2004/114391 | 12/2004 |
| WO | WO2008/133345 | 11/2008 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

(56) References Cited

OTHER PUBLICATIONS

Ikeda.T et al., "Full-Functional System Liquid Crystal Display Using CG-Silicon technology,", SID Digest '04 : SID International Symposium Digest of Technical Papers, 2004, vol. 35, pp. 860-863.
Nomura.K et al., "Room-Temperature Fabrication of Transparent Flexible Thin-Film Transistors Using Amorphous Oxide Semiconductors,", Nature, Nov. 25, 2004, vol. 432, pp. 488-492.
Park.J at al., "Improvements in the Device Characteristics of Amorphous Indium Gallium Zinc Oxide Thin-Film Transistors by Ar Plasma Treatment,", Appl. Phys. lett. (Applied Physics Letters), Jun. 26, 2007, vol. 90, No. 26, pp. 262106-1-262106-3.
Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.
Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.
Prins.M et al., "A Ferroelectric Transparent Thin-Film Transistor,", Appl. Phys. Lett. (Applied Physics Letters) , Jun. 17, 1996, vol. 68, No. 25, pp. 3650-3652.
Nakamura.M et al., "The phase relations in the In2O3—Ga2ZnO4—ZnO system at 1350° C,", Journal of Solid State Chemistry, Aug. 1, 1991, vol. 93, No. 2, pp. 298-315.
Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO Systems,", Journal of Solid State Chemistry, Apr. 1, 1995, vol. 116, No. 1, pp. 170-178.
Nomura.K et al., "Thin-Film Transistor Fabricated in Single-Crystalline Transparent Oxide Semiconductor,", Science, May 23, 2003, vol. 300, No. 5623, pp. 1269-1272.
Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.
Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.
Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.
Nomura.K et al., "Carrier transport in transparent oxide semiconductor with intrinsic structural randomness probed using single-crystalline InGaO3(ZnO)5 films,", Appl. Phys. Lett. (Applied Physics Letters) , Sep. 13, 2004, vol. 85, No. 11, pp. 1993-1995.
Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.
Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.
Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.
Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.
Kanno.H et al., "White Stacked Electrophosphorecent Organic Light-Emitting Devices Employing MoO3 as a Charge-Generation Layer,", Adv. Mater. (Advanced Materials), 2006, vol. 18, No. 3, pp. 339-342.
Tsuda.K et al., "Ultra Low Power Consumption Technologies for Mobile TFT-LCDs,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.
Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.
Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.
Park.J et al., "High performance amorphous oxide thin film transistors with self-aligned top-gate structure,", IEDM 09: Technical Digest of International Electron Devices Meeting, Dec. 7, 2009, pp. 191-194.
Kurokawa.Y et al., "UHF RFCPUS on Flexible and Glass Substrates for Secure RFID Systems,", Journal of Solid-State Circuits , 2008, vol. 43, No. 1, pp. 292-299.
Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.
Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.
Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.
Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.
Jin.D et al., "65.2:Distinguished Paper:World-Largest (6.5") Flexible Full Color Top Emission AMOLED Display on Plastic Film and its Bending Properties,", SID Digest '09 : SID International Symposium Digest of Teechnical Papers, May 31, 2009, pp. 983-985.
Sakata.J et al., "Development of 4.0-In. AMOLED Display With Driver Circuit Using Amorphous In—GA—Zn—Oxide TFTs,", IDW '09 : Proceedings of the 16th International Display Workshops, 2009, pp. 689-692.
Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.
Park.S et al., "Challenge to Future Displays: Transparent AM-OLED Driven by Peald Grown ZnO TFT,", IMID '07 Digest, 2007, pp. 1249-1252.
Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.
Osada.T et al., "Development of Driver-Integrated Panel Using Amorphous In—Ga—Zn—Oxide TFT,", AM-FPD '09 Digest of Technical Papers, Jul. 1, 2009, pp. 33-36.
Hirao.T et al., "Novel Top-Gate Zinc Oxide Thin-Film Transistors (ZnO TFTs) for AMLCDs,", Journal of the SID, 2007, vol. 15, No. 1, pp. 17-22.
Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.
Ohara.H et al., "21.3;4.0 In. QVGA AMOLED Display Using In—Ga—Zn—Oxide TFTs With a Novel Passivation Layer,", SID Digest '09 : SID International Symposium Digest of Technical Papers, May 31, 2009, pp. 284-287.
Miyasaka.M, "Suftla Flexible Microelectronics on Their Way to Business,", SID Digest '07 : SID International Symposium Digest of Technical Papers, 2007, vol. 38, pp. 1673-1676.

(56) References Cited

OTHER PUBLICATIONS

Chern.H et al., "An Analytical Model for the Above-Threshold Characteristics of Polysilicon Thin-Film Transistors,", IEEE Transactions on Electron Devices, Jul. 1, 1995, vol. 42, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N. et al., "Spinel,YbFe2O4, and Yb2Fe3O7 Types of Structures for Compounds in the In2O3 and Sc2O3—A2O3—BO Systems [A;Fe, Ga, or Al; B: Mg, Mn, Fe, Ni, Cu,or Zn] At temperatures over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104.3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

Nakayama et al., "17a—TL-8 Effect of GaO Layer on IGZO-TFT Channel," Extended Abstracts (The 57th Spring Meeting 2010), The Japan Society of Applied Physics and related Societies, Mar. 17, 2010, pp. 21-008.

\* cited by examiner

FIG. 19A
FIG. 19B
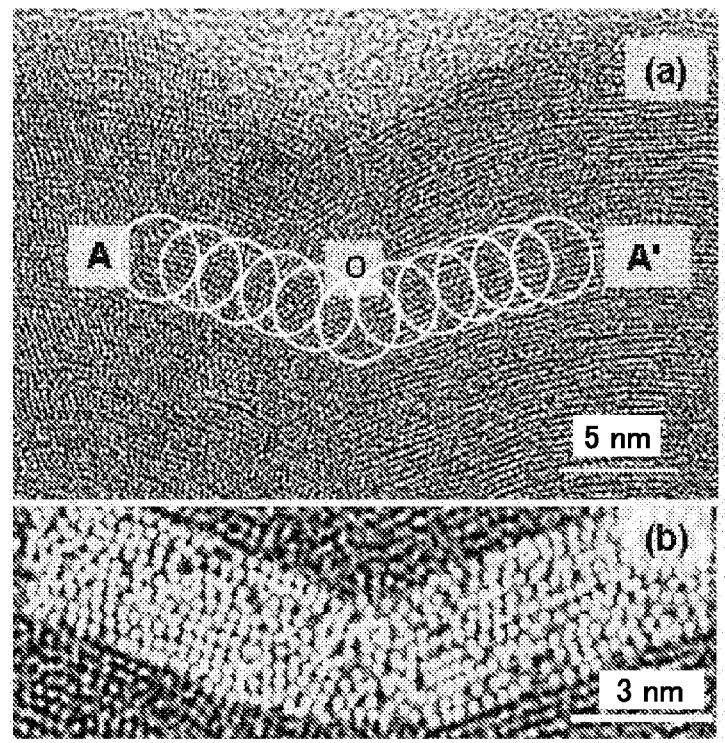
FIG. 19C
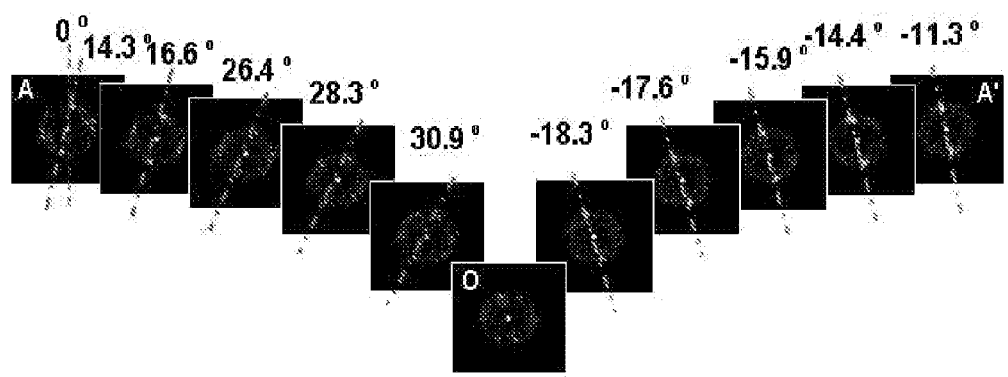

CAAC-OS nc-OS as-sputtered after 450 °C heating

SEMICONDUCTOR DEVICE HAVING BURIED CHANNEL STRUCTURE

BACKGROUND OF THE INVENTION

1. Field of the Invention

The present invention relates to a semiconductor device.

In this specification, a semiconductor device generally means a device which can function by utilizing semiconductor characteristics. A semiconductor element such as a transistor; a power device; an integrated circuit, a power supply circuit, or a power supply converter circuit each including a power device; an electro-optical device; a semiconductor circuit; and an electronic appliance may be included in a semiconductor device or may include a semiconductor device.

2. Description of the Related Art

As a semiconductor device used for a power device, a power device manufactured with the use of silicon is widely prevalent. However, the performance of a power device including silicon is reaching its limit, and it is becoming difficult to achieve higher performance.

In the case where silicon is used for a power device, there is a limitation on the temperature range of operation because the band gap of silicon is small. Thus, in recent years, a power device including SiC or GaN, which has a wide band gap, has been developed.

The use of an oxide semiconductor in a semiconductor device which is used as a power device for a high-power application is also disclosed (see Patent Documents 1 and 2).

REFERENCE

Patent Document

[Patent Document 1] Japanese Published Patent Application No. 2011-91382

[Patent Document 2] Japanese Published Patent Application No. 2011-172217

SUMMARY OF THE INVENTION

It is preferable that a transistor used for a power device for large power have ability to feed a high drain current.

An object of one embodiment of the present invention is to provide a semiconductor device or the like including an oxide semiconductor and suitable for a power device. Another object is to provide a semiconductor device in which large current can flow. Another object of the present invention is to provide a highly reliable semiconductor device. Another object is to provide a novel semiconductor device.

Note that the descriptions of these objects do not disturb the existence of other objects. In one embodiment of the present invention, there is no need to achieve all the objects. Other objects will be apparent from and can be derived from the description of the specification, the drawings, and the claims.

One embodiment of the present invention is a semiconductor device including a semiconductor layer over an insulating surface; a first electrode that includes an opening and a second electrode that is provided in the opening of the first electrode and separated from the first electrode, over the semiconductor layer; a gate insulating layer over the first electrode, the second electrode, and the semiconductor layer; and a ring-shaped gate electrode over the gate insulating layer. An inner edge portion of the ring-shaped gate electrode overlaps the second electrode and an outer edge portion of the ring-shaped gate electrode overlaps a region between the first electrode and the second electrode.

Another embodiment of the present invention is a semiconductor device including a semiconductor layer over an insulating surface; a first electrode that includes an opening and a second electrode that is provided in the opening of the first electrode and separated from the first electrode, over the semiconductor layer; a gate insulating layer over the first electrode, the second electrode, and the semiconductor layer; and a ring-shaped gate electrode over the gate insulating layer. An inner edge portion of the ring-shaped gate electrode overlaps a region between the first electrode and the second electrode, and an outer edge portion of the ring-shaped gate electrode overlaps the first electrode.

The semiconductor layer preferably includes an oxide semiconductor layer.

The semiconductor layer preferably has a stacked-layer structure in which the oxide semiconductor layer and a first oxide layer are stacked from the insulating surface side.

The semiconductor layer preferably has a stacked-layer structure in which a second oxide layer, the oxide semiconductor layer, and a first oxide layer are stacked from the insulating surface side.

Part of the oxide semiconductor layer that overlaps a region between the first electrode and the second electrode preferably contains an element that imparts conductivity to the oxide semiconductor layer.

For example, the element imparting conductivity is preferably any one of phosphorus, arsenic, antimony, boron, nitrogen, argon, helium, neon, fluorine, chlorine, and hydrogen.

The oxide semiconductor layer preferably includes a crystal region.

According to the present invention, a semiconductor device that includes an oxide semiconductor and is suitable for a power device can be provided. Further, a semiconductor device in which large current can flow can be provided. Furthermore, a highly reliable semiconductor device can be provided.

BRIEF DESCRIPTION OF THE DRAWINGS

FIGS. 19A and 19B each are cross-sectional transmission electron microscope (TEM) images, and FIG. 19C is a local Fourier transform image of an oxide semiconductor.

DETAILED DESCRIPTION OF THE INVENTION

Figure 1A:
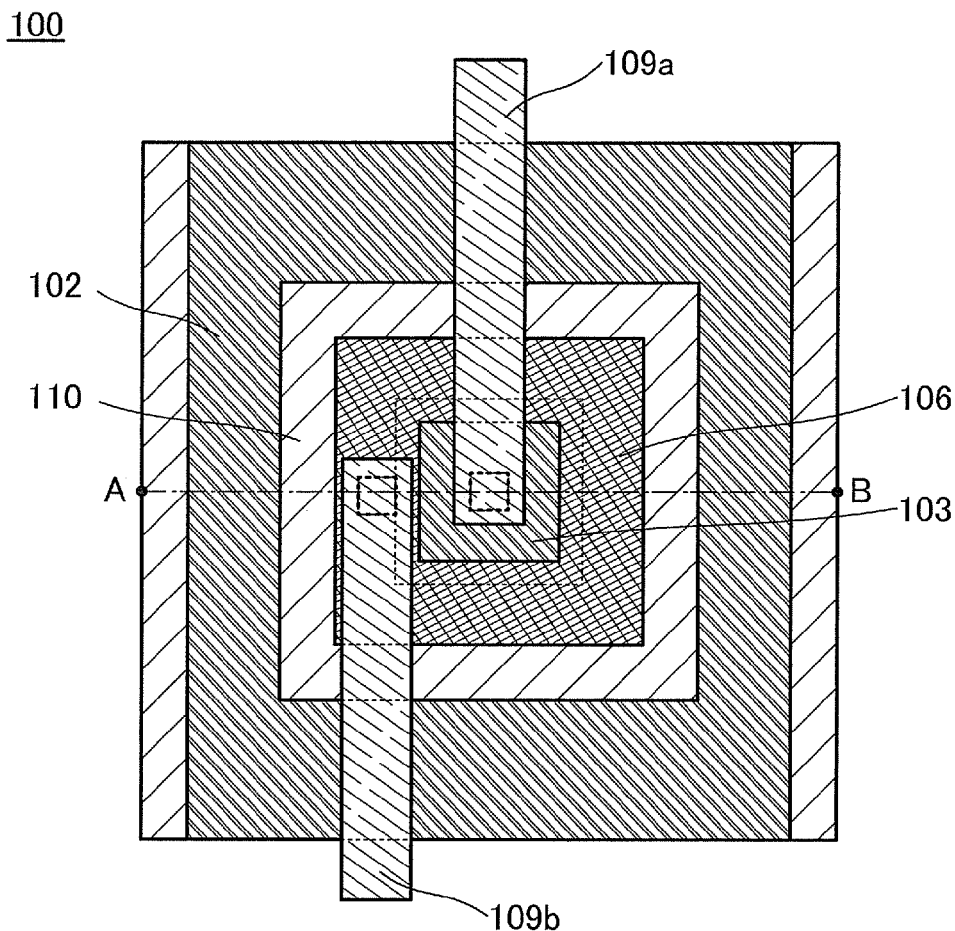
FIGS. 1A and 1B illustrate a structural example of a transistor of an embodiment.

Embodiments will be described in detail with reference to drawings. Note that the present invention is not limited to the description below, and it is easily understood by those skilled in the art that various changes and modifications can be made without departing from the spirit and scope of the present invention. Accordingly, the present invention should not be interpreted as being limited to the content of the embodiments below.

Note that in the structures of the invention described below, the same portions or portions having similar functions are denoted by the same reference numerals in different drawings, and description of such portions is not repeated. Further, the same hatching pattern is applied to portions having similar functions, and the portions are not especially denoted by reference numerals in some cases.

Note that in each drawing described in this specification, the size, the layer thickness, or the region of each component is exaggerated for clarity in some cases. Therefore, embodiments of the present invention are not limited to such a scale.

Note that in this specification and the like, ordinal numbers such as "first", "second", and the like are used in order to avoid confusion among components and do not limit the number.

A transistor is a kind of semiconductor elements and can achieve amplification of current or voltage, switching operation for controlling conduction or non-conduction, or the like. A transistor in this specification includes an insulated-gate field effect transistor (IGFET) and a thin film transistor (TFT).

Functions of a "source" and a "drain" are sometimes replaced with each other when a transistor of opposite polarity is used or when the direction of flow of current is changed in circuit operation, for example. Therefore, the terms "source" and "drain" can be used to denote the drain and the source, respectively, in this specification.

Note that in this specification and the like, the expression "electrically connected" includes the case where components are connected through an "object having any electric function". There is no particular limitation on an "object having any electric function" as long as electric signals can be transmitted and received between components that are connected through the object. Examples of an "object having any electric function" include a switching element such as a transistor, a resistor, a coil, a capacitor, and an element with a variety of functions in addition to an electrode and a wiring.

Embodiment 1

In this embodiment, a structural example of a semiconductor device of one embodiment of the present invention and an example of a method for forming the semiconductor device are described with reference to drawings. A transistor is described as an example of the semiconductor device.

Structural Example

Figure 1B:
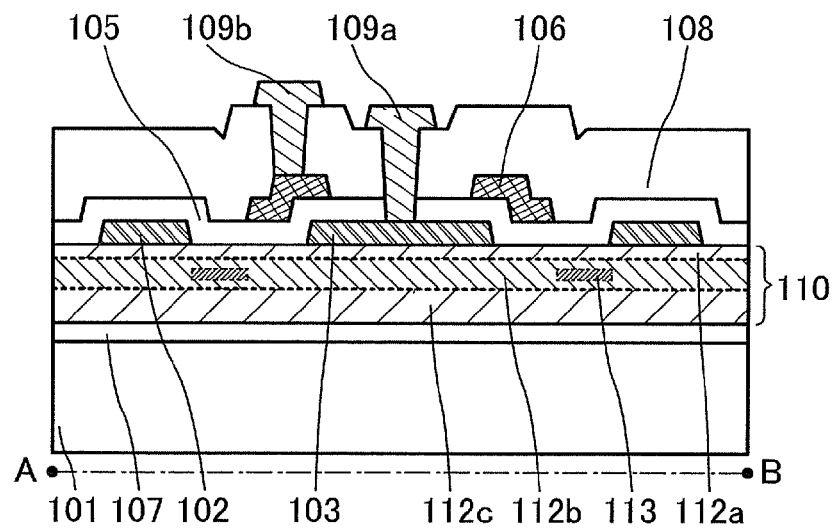

FIG. 1A is a schematic top view of a transistor 100 described in this embodiment, and FIG. 1B is a schematic cross-sectional view taken along line A-B in FIG. 1A.

In the transistor 100, an insulating layer 107 is provided over a substrate 101, and an oxide stack 110 including at least an oxide semiconductor layer 112b is provided over the insulating layer 107. Further, a first electrode 102 that has an opening portion and a second electrode 103 that is positioned in the opening portion of the first electrode 102 are separately provided on and in contact with the oxide stack 110. Furthermore, a gate insulating layer 105 is provided over the second electrode 103, the first electrode 102, and the oxide stack 110, and a ring-shaped gate electrode 106 is provided over the gate insulating layer 105. Here, the ring-shaped gate electrode 106 overlaps part of the second electrode 103 and part of the oxide stack 110. Specifically, an inner edge portion of the ring-shaped gate electrode 106 overlaps the second electrode 103 and an outer edge portion of the ring-shaped gate electrode 106 overlaps the oxide stack 110.

In this specification and the like, the ring-shaped electrode refers to an electrode having a closed shape which has an opening portion when seen from the above. The inner periphery and the outer periphery of the ring-shaped electrode are not necessarily circular, and at least one of the inner periphery and the outer periphery may have any of a variety of shapes (e.g., a polygonal shape and an elliptical shape).

An insulating layer 108 is provided to cover the gate insulating layer 105 and the gate electrode 106. An electrode 109a and an electrode 109b are provided over the insulating layer 108. The electrode 109a is electrically connected to the second electrode 103 through an opening portion formed in the insulating layer 108 and the gate insulating layer 105. The electrode 109b is electrically connected to the gate electrode 106 through an opening portion formed in the insulating layer 108.

Here, the first electrode 102 functions as a drain electrode of the transistor. The second electrode 103 functions as a source electrode of the transistor.

The oxide stack 110 has a stacked-layer structure in which a first oxide layer 112a, the oxide semiconductor layer 112b, and a second oxide layer 112c are stacked from a side close to the gate insulating layer 105. Here, a channel is mainly formed in the oxide semiconductor layer 112b included in the oxide stack 110, and current flows through the channel. In other words, the transistor 100 has a buried channel structure.

An element that imparts conductivity to an oxide semiconductor contained in the oxide semiconductor layer 112b is introduced into at least part of the oxide semiconductor layer 112b, which overlaps a region between the first electrode 102 and the second electrode 103, so that a region 113 that has increased conductivity is formed in the part. Phosphorus can be preferably used as the element.

In addition, examples of the element increasing conductivity of the oxide semiconductor include elements belonging to Group 15 (e.g., nitrogen (N), arsenic (As), and antimony (Sb)), boron (B), aluminum (Al), argon (Ar), helium (He), neon (Ne), indium (In), fluorine (F), chlorine (CO, hydrogen (H), titanium (Ti), and zinc (Zn)).

In the part of the oxide stack 110 which overlaps the region between the first electrode 102 and the second electrode 103, a region which does not overlap the gate electrode 106, what is called an offset region, is provided in the vicinity of the first electrode 102 functioning as a drain electrode in the transistor 100. Therefore, electric-field concentration at an edge of the channel on the drain side in an on state is inhibited and thus drain withstand voltage is improved. As a result, the transistor 100 can have high reliability. Further, the transistor 100 has a structure in which the gate electrode 106 and the first electrode 102 do not overlap each other, and thus withstand voltage between the gate and the drain is improved. Therefore, the transistor 100 can have high withstand voltage.

Since the first electrode 102 is formed to surround the second electrode 103, the channel width with respect to an area occupied by the transistor 100 can be large as compared to that in a transistor in which a pair of electrodes is provided to be parallel to each other. Such a structure is suitable when large current flows and can be favorably applied to a power device.

Further, since the offset region includes the region 113 having increased conductivity of the oxide semiconductor layer 112b, a reduction in on-state current caused by providing the offset region can be effectively inhibited. As a result, series resistance between the source and the drain is sufficiently reduced, so that larger current can flow therebetween.

The first oxide layer 112a is provided between the oxide semiconductor layer 112b and the gate insulating layer 105. Such a structure in which an interface between the gate insulating layer 105 and the oxide semiconductor layer 112b mainly including the channel is not formed does not cause generation of a trap state at the interface and thus inhibits generation of a trap state in the gate insulating layer 105 or in the oxide semiconductor layer 112b. Accordingly, a transistor having higher reliability can be obtained.

Similarly, when the second oxide layer 112c is provided between the oxide semiconductor layer 112b and the insulating layer 107, an interface between the oxide semiconductor layer 112b and the insulating layer 107 is not formed. Therefore, a highly reliable transistor can be obtained.

[Oxide Stack]

The stacked-layer structure included in one embodiment of the present invention is described below.

Structural Example

Figure 2A:
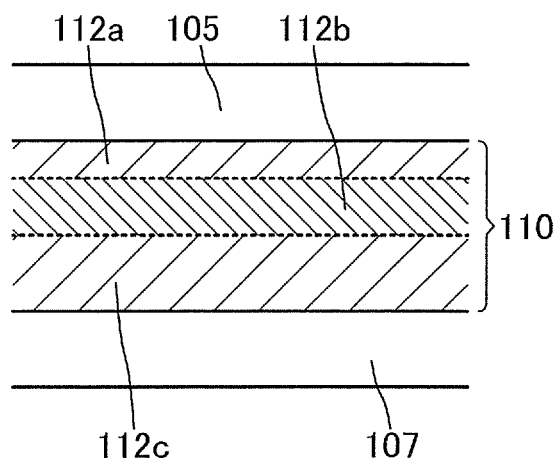
FIGS. 2A and 2B each illustrate a stacked-layer structure of an embodiment.

A stacked-layer structure illustrated in FIG. 2A includes the oxide stack 110 between the insulating layer 107 and the gate insulating layer 105. The oxide stack 110 includes the first oxide layer 112a, the oxide semiconductor layer 112b, and the second oxide layer 112c. Note that in the actual cross-sectional structure, the interfaces between the first oxide layer 112a and the oxide semiconductor layer 112b, and between the oxide semiconductor layer 112b and the second oxide layer 112c are often vague. Therefore, the interfaces are denoted by dashed lines in FIG. 2A.

The first oxide layer 112a and the second oxide layer 112c are each an oxide layer that contains one or more kinds of metal elements forming the oxide semiconductor layer 112b.

The oxide semiconductor layer 112b includes an oxide represented by In-M-Zn oxide, which contains at least indium, zinc, and M (M is a metal such as Al, Ga, Ge, Y, Zr, Sn, La, Ce, or Hf). The oxide semiconductor layer 112b preferably includes indium, because carrier mobility of the transistor is increased.

The first oxide layer 112a located above the oxide semiconductor layer 112b includes an oxide which is represented by an In-M-Zn oxide (M is a metal such as Al, Ti, Ga, Ge, Y, Zr, Sn, La, Ce, or Hf) and contains a larger atomic ratio of M than that in the oxide semiconductor layer 112b. Specifically, the atomic ratio of the above element in the first oxide layer 112a is 1.5 times or more, preferably twice or more, further preferably 3 times or more as large as that in the oxide semiconductor layer 112b. The above element is more strongly bonded to oxygen than indium, and thus has a function of suppressing generation of oxygen vacancy in the oxide layer. That is, oxygen vacancy is more unlikely to be generated in the first oxide layer 112a than in the oxide semiconductor layer 112b.

The second oxide layer 112c below the oxide semiconductor layer 112b includes an oxide which is represented by an In-M-Zn oxide (M is a metal such as Al, Ti, Ga, Ge, Y, Zr, Sn, La, Ce, or Hf) and, in a manner similar to the first oxide layer 112a, the second oxide layer 112c contains a larger atomic ratio of M than that in the oxide semiconductor layer 112b. Specifically, the atomic ratio of the above element in the second oxide layer 112c is 1.5 times or more, preferably twice or more, further preferably 3 times or more as large as that in the oxide semiconductor layer 112b. Therefore, oxygen vacancy is more unlikely to be generated in the second oxide layer 112c than in the oxide semiconductor layer 112b.

It is preferred that a chemical composition of the oxide semiconductor layer 112b be different from those of the first oxide layer 112a and the second oxide layer 112c. Specifically, when each of the first oxide layer 112a, the oxide semiconductor layer 112b, and the second oxide layer 112c is an In-M-Zn oxide containing at least indium, zinc, and M (M is a metal such as Al, Ti, Ga, Ge, Y, Zr, Sn, La, Ce, or Hf), and the first oxide layer 112a has an atomic ratio of In:M:Zn=$x_1$:$y_1$:$z_1$, the oxide semiconductor layer 112b has an atomic ratio of In:M:Zn=$x_2$:$y_2$:$z_2$, and the second oxide layer 112c has an atomic ratio of In:M:Zn=$x_3$:$y_3$:$z_3$, each of $y_1/x_1$ and $y_3/x_3$ is preferably larger than $y_2/x_2$. Each of $y_1/x_1$ and $y_3/x_3$ is 1.5 times or more, preferably twice or more, further preferably 3 times or more as large as $y_2/x_2$. At this time, when $y_2$ is greater than or equal to $x_2$ in the oxide semiconductor layer 112b, a transistor can have stable electrical characteristics. However, when $y_2$ is 3 times or more as large as $x_2$, the field-effect mobility of the transistor is reduced; accordingly, $y_2$ is preferably less than 3 times $x_2$.

Note that in the case where the first oxide layer 112a is an In-M-Zn oxide, on the assumption that the total atomic percentage of In and M is 100 atomic %, it is preferable that the atomic percentage of In be less than 75 atomic % and the atomic percentage of M be greater than or equal to 25 atomic %; further preferably, the atomic percentage of In be less than 50 atomic % and the atomic percentage of M be greater than or equal to 50 atomic %; and still further preferably, the atomic percentage of In be less than 25 atomic % and the atomic percentage of M be greater than or equal to 75 atomic %.

In the case where the oxide semiconductor layer 112b is an In-M-Zn oxide, on the assumption that the total atomic percentage of In and M is 100 atomic %, it is preferable that the atomic percentage of In be greater than or equal to 25 atomic % and the atomic percentage of M be less than 75 atomic %, and further preferably, the atomic percentage of In be greater than or equal to 34 atomic % and the atomic percentage of M be less than 66 atomic %.

In the case where the second oxide layer 112c is an In-M-Zn oxide, on the assumption that the total atomic percentage of In and M is 100 atomic %, it is preferable that the atomic percentage of In be less than 75 atomic % and the atomic percentage of M be greater than or equal to 25 atomic %; further preferably, the atomic percentage of In be less than 50 atomic % and the atomic percentage of M be greater than or equal to 50 atomic %; and still further preferably, the atomic percentage of In be less than 25 atomic % and the atomic percentage of M be greater than or equal to 75 atomic %.

The constituent elements of the first oxide layer 112a and the second oxide layer 112c may be different from each other, or their constituent elements may be the same at the same atomic ratios or different atomic ratios.

An oxide semiconductor containing, for example, indium, zinc, and gallium can be used for the first oxide layer 112a, the oxide semiconductor layer 112b, and the second oxide layer 112c.

The thickness of each of the first oxide layer 112a, the oxide semiconductor layer 112b, and the second oxide layer 112c may be set as appropriate in accordance with electrical characteristics (e.g., the output voltage) needed for the transistor 100. For example, the thickness of the first oxide layer 112a is greater than or equal to 3 nm and less than or equal to 500 nm, preferably greater than or equal to 3 nm and less than or equal to 100 nm, further preferably greater than or equal to 3 nm and less than or equal to 50 nm. The thickness of the oxide semiconductor layer 112b is greater than or equal to 3 nm and less than or equal to 500 nm, preferably greater than or equal to 3 nm and less than or equal to 200 nm, further preferably greater than or equal to 3 nm and less than or equal to 100 nm, still further preferably greater than or equal to 3 nm and less than or equal to 50 nm. The thickness of the second oxide layer 112c is preferably greater than or equal to the thickness of each of the first oxide layer 112a and the oxide semiconductor layer 112b.

As described above, it is preferable that the first oxide layer 112a and the second oxide layer 112c contain one or more kinds of metal elements forming the oxide semiconductor layer 112b. The first oxide layer 112a and the second oxide layer 112c are preferably formed using an oxide semiconductor whose energy of the bottom of the conduction band is closer to the vacuum level than that of the oxide semiconductor layer 112b by 0.05 eV or more, 0.07 eV or more, 0.1 eV or more, or 0.15 eV or more and 2 eV or less, 1 eV or less, 0.5 eV or less, or 0.4 eV or less.

When an electric field is applied to the gate electrode provided over the gate insulating layer 105 in such a structure, the channel is mainly formed in the oxide semiconductor layer 112b whose bottom of the conduction band has the smallest energy among those of the layers in the oxide stack 110. That is, since the first oxide layer 112a is formed between the gate insulating layer 105 and the oxide semiconductor layer 112b, the structure in which the channel of the transistor is not in contact with the gate insulating layer 105 can be obtained. In other words, the channel of the transistor can be spaced from the gate insulating layer 105.

Note that the first oxide layer 112a may function as a gate insulating layer. In the case where the first oxide layer 112a has a sufficiently large band gap, the first oxide layer 112a does not have the properties of a semiconductor but has properties as an insulator or properties close to those of an insulator, and thus can function as a gate insulating layer.

Figure 2B:
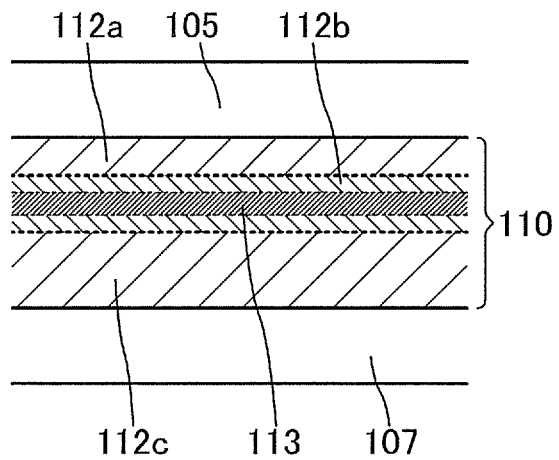

The stacked-layer structure illustrated in FIG. 2B includes the region 113 having increased conductivity in the oxide semiconductor layer 112b.

Although a structure in which the region 113 having increased conductivity is provided in the center part of the oxide semiconductor layer 112b is illustrated here, the region may be formed in the entire region of the oxide semiconductor layer 112b in the thickness direction, or may be formed in contact with the first oxide layer 112a or the second oxide layer 112c. Alternatively, the region 113 may extend to one or both of the first oxide layer 112a and the second oxide layer 112c.

As described above, the region 113 has the element imparting conductivity to an oxide semiconductor. It is preferable to use phosphorus as the element.

The phosphorus contained in the oxide semiconductor is bonded to oxygen in the oxide semiconductor. As a result, oxygen vacancy is generated in the oxide semiconductor, an impurity state is formed in the band gap, and the impurity state serves as a donor and generates an electron, so that the oxide semiconductor may become n-type. That is, by introducing phosphorus to the oxide semiconductor, the oxide semiconductor can become n-type. Accordingly, the region 113 can also be referred to as an n-type region.

As mentioned above, as the element contained in the region 113, in addition to phosphorus (P), elements belonging to Group 15 (e.g., nitrogen (N), arsenic (As), and antimony (Sb)), boron (B), argon (Ar), helium (He), neon (Ne), fluorine (F), chlorine (CO, and hydrogen (H) may be used.

The concentration of the element of the region 113 is, for example, higher than or equal to $1\times10^{15}$ atoms/cm$^3$ and lower than or equal to $1\times10^{20}$ atoms/cm$^3$, preferably higher than or equal to $1\times10^{15}$ atoms/cm$^3$ and lower than or equal to $1\times10^{18}$ atoms/cm$^3$, further preferably higher than or equal to $1\times10^{16}$ atoms/cm$^3$ and lower than or equal to $1\times10^{18}$ atoms/cm$^3$. The carrier density of the region 113 is increased with the introduction of the element. When the concentration of the element is low, the effect of increasing the on-state current of the transistor is reduced; when the concentration is too high, deficiency occurs, for example, the switching characteristics of the transistor cannot be obtained (the transistor is not turned off or pinch-off does not occur).

Note that the concentration of the element of the oxide stack 110 can be measured by secondary ion mass spectrometry (SIMS).

Examples of a method for introducing the element into the oxide semiconductor layer 112b include an ion implantation method, an ion doping method, and a plasma immersion ion implantation method.

The region 113 may have a gradient in which the concentration of the element successively changes in the thickness direction of the oxide semiconductor layer 112b. Here, in the concentration distribution in the thickness direction, a region having the highest concentration of the element is preferably positioned inside the oxide semiconductor layer 112b. Alternatively, a concentration gradient of the element may be formed so as to successively change from the oxide semiconductor layer 112b toward the first oxide layer 112a. Similarly, a gradient may be provided to successively change from the oxide semiconductor layer 112b toward the second oxide layer 112c.

Such a structure can effectively increase the conductivity of the oxide semiconductor layer 112b where current mainly flows. The above stacked-layer structure in the offset region of the transistor allows the effective reduction in the series resistance between the source and the drain of the transistor.

The region 113 with increased conductivity in the oxide semiconductor layer 112b makes it possible to obtain a structure in which the second oxide layer 112c and part of the oxide semiconductor layer 112b are positioned between the region 113 and the insulating layer 107. Therefore, it is possible to avoid the reduction in the mobility owing to mixing of the element contained in the insulating layer 107 (e.g., silicon) into the region 113 that mainly serves as a current path. Similarly, with a structure in which the first oxide layer 112a and part of the oxide semiconductor layer 112b are positioned between the region 113 and the gate insulating layer 105, a reduction in the mobility owing to mixing of the element contained in the gate insulating layer 105 (e.g., silicon) into the region 113 can be inhibited.

<Band Structure of Oxide Stack>

The band structure of the oxide stack 110 is described.

Figure 3A:
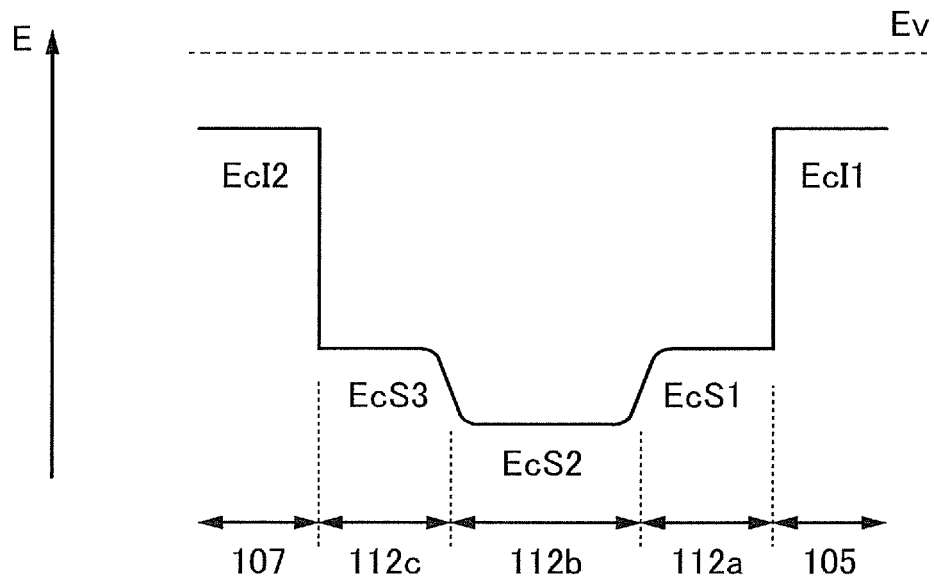
FIGS. 3A and 3B each show a band diagram of an embodiment.
Figure 3B:
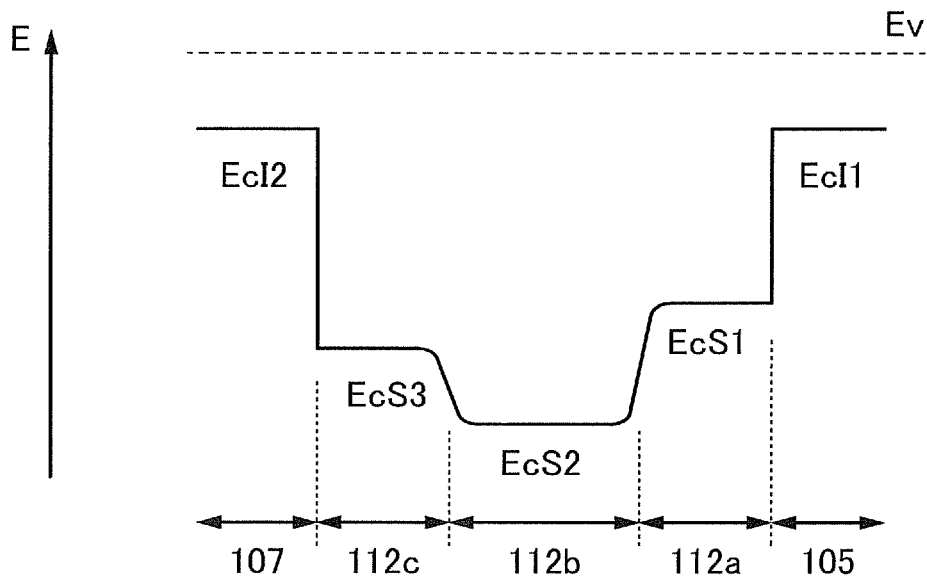

FIGS. 3A and 3B each schematically illustrate part of the energy band structure in the thickness direction of the stacked-layer structure in FIG. 2A.

In FIGS. 3A and 3B, EcI1, EcS1, EcS2, EcS3, and EcI2 schematically represent the energies of the bottoms of the conduction band in the gate insulating layer 105, the first oxide layer 112a, the oxide semiconductor layer 112b, the second oxide layer 112c, and the insulating layer 107, respectively. Note that the thicknesses of the layers in FIG. 2A are not considered here for convenience.

Here, an energy difference between the vacuum level (Ev) and the bottom of the conduction band (the difference is also referred to as electron affinity) corresponds to a value obtained by subtracting an energy gap from an energy difference between the vacuum level and the top of the valence band (the difference is also referred to as an ionization potential). The energy gap can be measured using a spectroscopic ellipsometer (e.g., UT-300 manufactured by HORIBA JOBIN YVON S.A.S.). The energy difference between the vacuum level and the valence band top can be measured using an ultraviolet photoelectron spectroscopy (UPS) device (e.g., VersaProbe manufactured by ULVAC-PHI, Inc.).

As illustrated in FIG. 3A, the energy of the bottom of the conduction band continuously changes between the first oxide layer 112a and the oxide semiconductor layer 112b and between the oxide semiconductor layer 112b and the second oxide layer 112c without any barrier between them. This is because oxygen is easily diffused between the first oxide layer 112a and the oxide semiconductor layer 112b, and between the oxide semiconductor layer 112b and the second oxide layer 112c since these layers have similar compositions, and thus a layer what can be regarded as a mixed layer is formed therebetween.

Although FIG. 3A illustrates the case where the first oxide layer 112a and the second oxide layer 112c are oxide layers having the same energy gap, they may have different energy gaps. For example, in the case where EcS1 is higher than EcS3, the band structure can be illustrated as in FIG. 3B. Although not illustrated, EcS3 may be higher than EcS1.

According to FIGS. 3A and 3B, the oxide semiconductor layer 112b in the oxide stack 110 forms a well, and a channel is formed in the oxide semiconductor layer 112b. Note that since the energy of the bottom of the conduction band in the oxide stack continuously changes, the structure of the oxide stack 110 can also be referred to as a U-shaped well. Further, a channel having such a structure can also be referred to as a buried channel.

Figure 4:
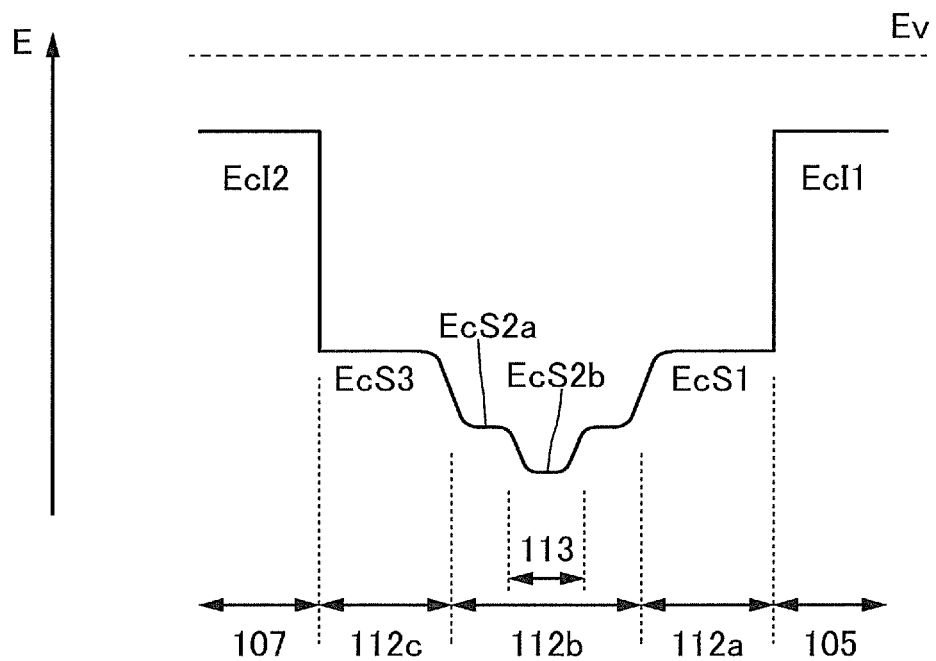
FIG. 4 shows a band diagram of an embodiment.

FIG. 4 schematically shows the energy band structure in the thickness direction of the stacked-layer structure illustrated in FIG. 2B.

In FIG. 4, EcS2a and EcS2b represent the energies of the bottoms of the conduction band in the oxide semiconductor layer 112b and the region 113, respectively. The energy of the bottom of the conduction band in the region 113 is lower than that in the oxide semiconductor layer 112b.

As illustrated in FIG. 4, the energy of the bottom of the conduction band continuously changes between the oxide semiconductor layer 112b and the region 113 without any barrier between them. This is because the concentration of the element imparting conductivity contained in the region 113 distributes in the thickness direction.

The element contained in the region 113 might be diffused into the oxide semiconductor layer 112b by heat treatment or the like which is performed after formation of the oxide semiconductor layer 112b. In such a case, the concentration of the element continuously changes from the region 113 toward the first oxide layer 112a or from the region 113 toward the second oxide layer 112c. As a result, as illustrated in FIG. 4, the energy of the bottom of the conduction band continuously changes also between the region 113 and the oxide semiconductor layer 112b without any barrier therebetween.

Accordingly to FIG. 4, in the oxide stack 110, the oxide semiconductor layer 112b forms a first well, and the region 113 in the oxide semiconductor layer 112b forms a second well. In other words, a well is formed in a buried channel. Such a structure having two wells can also be referred to as a double well structure. The well provided in the oxide semiconductor layer 112b allows larger current to flow therethrough.

Further, the well formed by the region 113 is apart from the interface between first oxide layer 112a and the gate insulating layer 105 and the interface between the second oxide layer 112c and the insulating layer 107, and thus trap levels at the interfaces can be prevented from influencing the region 113 serving as a main carrier path of the transistor.

The above is the description of the band structure of the oxide stack.

<Formation of Oxide Stack>

The first oxide layer 112a and the second oxide layer 112c are oxides that contain one or more kinds of metal elements contained in the oxide semiconductor layer 112b; therefore, the oxide stack 110 can also be referred to as an oxide stack including the layers having the same main components. The oxide stack 110 is preferably formed to have a continuous junction (here, in particular, a well structure having a U-shape in which the conduction band minimum energies change continuously between the layers). This is because when an impurity which forms a defect level such as a trapping center or a recombination center is mixed at an interface between the layers, the continuity of the energy band is lost, and thus carriers are trapped or disappear by recombination at the interface.

In order to form a continuous junction, the layers are preferably stacked successively without exposure to the air with the use of a multi-chamber deposition apparatus (e.g., a sputtering apparatus) including a load lock chamber. Each chamber in the sputtering apparatus is preferably evacuated to high vacuum (for example, lower than or equal to $1\times10^{-4}$ Pa and higher than or equal to $5\times10^{-7}$ Pa) with an entrapment vacuum evacuation pump such as a cryopump so that water or the like, which is an impurity for an oxide semiconductor, is removed as much as possible. Alternatively, a turbo molecular pump and a cold trap are preferably used in combination to prevent backflow of gas into the chamber from an evacuation system.

Not only high vacuum evacuation in a chamber but also high purity of a sputtering gas is necessary to obtain a high-purity intrinsic oxide semiconductor. When an oxygen gas or an argon gas used as a sputtering gas is highly purified so as to have a dew point of $-40°$ C. or lower, preferably $-80°$ C. or lower, more preferably −100° C. or lower, moisture or the like can be prevented from entering an oxide semiconductor as much as possible.

The first oxide layer 112a provided above the oxide semiconductor layer 112b, and the second oxide layer 112c provided below the oxide semiconductor layer 112b function as barrier layers by which the trap level formed at the interface between the insulating layer in contact with the oxide stack 110 (the insulating layer 107 and the gate insulating layer 105) and the oxide stack 110 does not affect the oxide semiconductor layer 112b that serves as the main carrier path of the transistor.

For example, oxygen vacancy contained in the oxide semiconductor layer exists as localized states at deep energy potential in the energy gap of the oxide semiconductor. A carrier is trapped in such localized states, so that reliability of the transistor is lowered. For this reason, oxygen vacancy contained in the oxide semiconductor layer need to be reduced. In the oxide stack 110, the oxide layers in which oxygen vacancy is less likely to be generated than in the oxide semiconductor layer 112b are provided on and under the oxide semiconductor layer 112b to be in contact with the oxide semiconductor layer 112b, whereby oxygen vacancy in the oxide semiconductor layer 112b can be reduced. For example, in the oxide semiconductor layer 112b, the absorption coefficient due to the localized levels, which is obtained by measurement by a constant photocurrent method (CPM), can be controlled to be lower than $1\times10^{-3}$/cm or lower than $1\times10^{-4}$/cm.

In addition, when the oxide semiconductor layer 112b is in contact with an insulating layer which has an element other than indium, zinc, M, and oxygen (e.g., a base insulating layer including a silicon oxide film), an interface state is sometimes formed at the interface of the two layers to form a channel. At this time, a second transistor having a different threshold voltage appears, so that an apparent threshold voltage of the transistor is varied. However, since the second oxide layer 112c contains one or more kinds of metal elements forming the oxide semiconductor layer 112b in the oxide stack 110, an interface state is less likely to be formed at the interface between the second oxide layer 112c and the oxide semiconductor layer 112b. Thus, the second oxide layer 112c makes it possible to reduce variation in the electrical characteristics of the transistor, such as threshold voltage.

When a channel is formed at the interface between the gate insulating layer 105 and the oxide semiconductor layer 112b, interface scattering occurs at the interface and the field-effect mobility of the transistor is reduced. However, since the first oxide layer 112a contains one or more kinds of metal elements forming the oxide semiconductor layer 112b in the oxide stack 110, scattering of carriers is less likely to occur at the interface between the oxide semiconductor layer 112b and the first oxide layer 112a, and thus the field-effect mobility of the transistor can be increased.

Further, the first oxide layer 112a and the second oxide layer 112c each also serve as a barrier layer which inhibits formation of an impurity level due to the entry of the constituent elements of the insulating layers (the insulating layer 107 and the gate insulating layer 105) which are in contact with the oxide stack 110 into the oxide semiconductor layer 112b.

For example, when a silicon-containing insulating layer is used for the insulating layer 107 or the gate insulating layer 105 which is in contact with the oxide stack 110, silicon in the insulating layer or carbon that might be mixed into the insulating layer can enter the first oxide layer 112a or the second oxide layer 112c at a depth of several nanometers from the interface. An impurity such as silicon, carbon, or the like entering the oxide semiconductor layer 112b forms impurity levels. The impurity levels serve as a donor and generates an electron, so that the oxide semiconductor layer may become n-type.

However, when the thicknesses of the first oxide layer 112a and the second oxide layer 112c are larger than several nanometers, the impurity such as silicon or carbon does not reach the oxide semiconductor layer 112b, so that the influence of impurity levels is suppressed.

Here, the concentration of silicon in the oxide semiconductor layer 112b is lower than or equal to $3\times10^{18}$ atoms/cm$^3$, preferably lower than or equal to $3\times10^{17}$ atoms/cm$^3$. Further, the concentration of carbon in the oxide semiconductor layer 112b is lower than or equal to $3\times10^{18}$ atoms/cm$^3$, preferably lower than or equal to $3\times10^{17}$ atoms/cm$^3$. In particular, the oxide semiconductor layer 112b serving as a carrier path is preferably sandwiched or capsuled by the first oxide layer 112a and the second oxide layer 112c in order to prevent entry of silicon or carbon as much as possible, which is a Group 14 element, to the oxide semiconductor layer 112b. That is, the concentrations of silicon and carbon contained in the oxide semiconductor layer 112b are each preferably lower than those of the first oxide layer 112a and the second oxide layer 112c.

Note that the impurity concentration of the oxide semiconductor layer can be measured by secondary ion mass spectrometry (SIMS).

Note that a trap level due to an impurity or defect might be formed in the vicinity of the interface between the first oxide layer 112a or the second oxide layer 112c and the insulating film such as the silicon oxide film. The presence of the first oxide layer 112a and the presence of the second oxide layer 112c enable the oxide semiconductor layer 112b to be apart from the trap level. Note that in the case where the difference between the EcS1 and EcS2 or between EcS2 and EcS3 is small, electrons in the oxide semiconductor layer 112b might reach the trap level by passing over the energy difference. When the electron is captured by the trap state, negative fixed charge is generated, so that the threshold voltage of the transistor is shifted to the positive direction.

Thus, the energy difference between EcS1 and EcS2 and the energy difference between EcS3 and EcS2 are each preferably greater than or equal to 0.1 eV, more preferably greater than or equal to 0.15 eV because the change of the threshold voltage of the transistor is reduced and the transistor has stable electrical characteristics.

Each of the oxide layers included in the oxide stack 110 is formed with a sputtering method, preferably a DC sputtering method, by using a target containing at least indium (In). When the sputtering target contains indium, the conductivity thereof is increased; therefore, film formation by a DC sputtering method is facilitated.

As a material forming the first oxide layer 112a and the second oxide layer 112c, a material which is represented as an In-M-Zn oxide (M is a metal such as Al, Ti, Ga, Ge, Y, Zr, Sn, La, Ce, or Hf) is used. As M, Ga is preferably used. For example, a material which can be represented as InGa$_X$Zn$_Y$O$_Z$ ($3\leq X\leq 6$, $1\leq Y\leq 10$, $Z>0$) is preferably used. However, a material with a high proportion of Ga, specifically the material represented as InGa$_X$Zn$_Y$O$_Z$ with Y exceeding 10, is not suitable because particles may be generated during the deposition and deposition by a sputtering method may become difficult.

Note that for each of the first oxide layer 112a and the second oxide layer 112c, a material in which the atomic ratio of indium is smaller than that in a material used for the oxide semiconductor layer 112b is employed. The indium and gallium contents in the oxide layers can be estimated with each other by time-of-flight secondary ion mass spectrometry (also referred to as TOF-SIMS) or X-ray photoelectron spectrometry (also referred to as XPS).

Each of the oxide layers included in the oxide stack 110 may be a non-single-crystal. The non-single-crystal is exemplified by c-axis aligned crystal (CAAC), polycrystal, microcrystal, and an amorphous state, and so on. Among them, an amorphous state has the highest density of defect states, whereas CAAC has the lowest density of defect state. Note that the CAAC oxide semiconductor film is described in detail later.

A microcrystalline oxide film, for example, includes a microcrystal of greater than or equal to 1 nm and less than 10 nm (such a microcrystal is also referred to as a nanocrystal). Details of the nanocrystal oxide semiconductor film are described later.

An amorphous oxide film has a region in which atomic arrangement is disordered and crystalline component is absent. In some cases, whole of the film is in an amorphous state. Details of the amorphous oxide semiconductor film are described below.

Note that the oxide layers included in the oxide stack 110 may each be a mixed film including any of a CAAC oxide, a microcrystalline oxide, and an amorphous oxide. The mixed film, for example, may include an amorphous region, a microcrystalline region, and a CAAC region. Alternatively, the mixed film may have a layered structure including an amorphous region, a microcrystalline region, and a CAAC region, for example.

Each of the oxide layers included in the oxide stack 110 may be a single-crystal.

When the second oxide layer 112c contains a constituent element (e.g., silicon) of the insulating layer 107 as an impurity, the crystallinity of the second oxide layer 112c might be lowered. Note that the oxide semiconductor layer 112b in which a channel is formed preferably has a crystal part. In the case where the oxide semiconductor layer 112b having a crystal part is stacked over the second oxide layer 112c having an amorphous structure, the oxide stack can be referred to as a hetero structure having lowered crystallinity.

In addition, the first oxide layer 112a preferably includes a crystal part. Formation of the first oxide layer 112a over the oxide semiconductor layer 112b having a crystal part allows the first oxide layer 112a to have a crystal structure. In this case, a boundary between the oxide semiconductor layer 112b and the first oxide layer 112a cannot be clearly recognized by the cross section with a transmission electron microscope (TEM) in some cases. Note that the second oxide layer 112c has lower crystallinity than the oxide semiconductor layer 112b in many cases. Therefore, the boundary can be recognized by the degree of crystallinity.

<Crystallinity of Oxide>

Note that at least the oxide semiconductor layer 112b of the oxide stack 110 is preferably a CAAC-OS film. Further, all of the first oxide layer 112a, the oxide semiconductor layer 112b, and the second oxide layer 112c are preferably CAAC-OS films.

In this specification, a term "parallel" indicates that an angle formed between two straight lines is greater than or equal to −10° and less than or equal to 10°, and accordingly also includes the case where the angle is greater than or equal to −5° and less than or equal to 5°. In addition, a term "perpendicular" indicates that an angle formed between two straight lines is greater than or equal to 80° and less than or equal to 100°, and accordingly includes the case where the angle is greater than or equal to 85° and less than or equal to 95°.

A structure of the oxide semiconductor film is described below.

An oxide semiconductor film is classified roughly into a single-crystal oxide semiconductor film and a non-single-crystal oxide semiconductor film. The non-single-crystal oxide semiconductor film includes any of a c-axis aligned crystalline oxide semiconductor (CAAC-OS) film, a polycrystalline oxide semiconductor film, a microcrystalline oxide semiconductor film, an amorphous oxide semiconductor film, and the like.

First, a CAAC-OS film is described.

The CAAC-OS film is one of oxide semiconductor films having a plurality of c-axis aligned crystal parts.

In a TEM image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

FIG. 19A is a cross-sectional TEM image of a CAAC-OS film. FIG. 19B is a cross-sectional TEM image obtained by enlarging the image of FIG. 19A. In FIG. 19B, atomic arrangement is highlighted for easy understanding.

FIG. 19C is Fourier transform images of regions each surrounded by a circle (the diameter is about 4 nm) between A and O and between O and A' in FIG. 19A. C-axis alignment can be observed in each region in FIG. 19C. The c-axis direction between A and O is different from that between O and A', which indicates that a grain in the region between A and O is different from that between O and A'. In addition, between A and O, the angle of the c-axis continuously and gradually changes from 14.3°, 16.6° to 26.4°. Similarly, between O and A', the angle of the c-axis continuously changes from −18.3°, −17.6°, to −15.9°.

An electron diffraction pattern of the CAAC-OS film gives spots, indicating atomic alignment. For example, when electron diffraction with an electron beam having a diameter of 1 nm or more and 30 nm or less (such electron diffraction is also referred to as nanobeam electron diffraction) is performed on the top surface of the CAAC-OS film, spots are observed (see FIG. 20A).

From the results of the cross-sectional TEM images and the plan TEM image, alignment is found in the crystal parts in the CAAC-OS film.

Most of the crystal parts included in the CAAC-OS film each fit inside a cube whose one side is less than 100 nm. Thus, there is a case where a crystal part included in the CAAC-OS film fits inside a cube whose one side is less than 10 nm, less than 5 nm, or less than 3 nm Note that when a plurality of crystal parts included in the CAAC-OS film are connected to each other, one large crystal region is formed in some cases. For example, a crystal region with an area of 2500 nm$^2$ or more, 5 μm$^2$ or more, or 1000 μm$^2$ or more is observed in some cases in the plan TEM image.

A structural analysis with an X-ray diffraction (XRD) apparatus of a CAAC-OS film, such as a CAAC-OS film including an InGaZnO$_4$ crystal, by an out-of-plane method frequently gives a peak at a diffraction angle (2θ) of around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the InGaZnO$_4$ crystal. Six peaks are observed in an analysis (ϕ scan) of single-crystal oxide semiconductor film of InGaZnO$_4$ under the conditions where the sample is rotated about a normal vector of a sample surface as an axis (ϕ axis) with 2θ fixed at around 56°. The six peaks are derived from crystal planes equivalent to the (110) plane. On the other hand, in the case of a CAAC-OS film, a peak is not clearly observed even when ϕ scan is performed with 2θ fixed at around 56°.

The above results mean that in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Further, distribution of c-axis aligned crystal parts in the CAAC-OS film is not necessarily uniform. For example, in the case where crystal growth leading to the crystal parts of the CAAC-OS film occurs from the vicinity of the top surface of the film, the proportion of the c-axis aligned crystal parts in the vicinity of the top surface is higher than that in the vicinity of the formation surface in some cases. Further, in the CAAC-OS film to which an impurity is added, a region to which the impurity is added may be deformed, and the proportion of the c-axis aligned crystal parts in the CAAC-OS film may vary depending on regions.

Note that when the CAAC-OS film with an InGaZnO$_4$ crystal is analyzed by an out-of-plane method, a peak of 2θ can also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appears at around 31° and a peak of 2θ do not appear at around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Further, iron, nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. Oxygen vacancies in the oxide semiconductor film tend to serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has a low density of defect states, and thus has few carrier traps. Accordingly, the transistor including the oxide semiconductor film has little variation in electrical characteristics and high reliability. Electric charge trapped by the carrier traps in the oxide semiconductor film requires a long time to be released, and might behave like fixed charge. Thus, the transistor which includes the oxide semiconductor film having high impurity concentration and a high density of defect states tends to have unstable electrical characteristics.

With the use of the CAAC-OS film in a transistor, variation in the electrical characteristics of the transistor due to irradiation with visible light or ultraviolet light is small.

Next, a polycrystalline oxide semiconductor film is described.

In a TEM image of the polycrystalline oxide semiconductor film crystal grains and their boundary can be found. In most cases, the size of a crystal grain in the polycrystalline oxide semiconductor film is greater than or equal to 2 nm and less than or equal to 300 nm, greater than or equal to 3 nm and less than or equal to 100 nm, or greater than or equal to 5 nm and less than or equal to 50 nm.

The polycrystalline oxide semiconductor film includes a plurality of crystal grains. The alignment of the crystals may be different in the plurality of crystal grains. When a polycrystalline oxide semiconductor film, such as that including an InGaZnO$_4$ crystal, is subjected to structural analysis with an XRD apparatus by an out-of-plane method, peaks of 2θ appear at around 31°, 36°.

The polycrystalline oxide semiconductor film has high crystallinity and thus has high electron mobility. Accordingly, a transistor including the polycrystalline oxide semiconductor film has high field-effect mobility. However, there are cases in which an impurity is segregated at the grain boundary between the crystals in the polycrystalline oxide semiconductor. Moreover, the grain boundary of the polycrystalline oxide semiconductor film may serves as a defect state, a carrier trap, or a carrier generation source; therefore, a transistor including the polycrystalline oxide semiconductor film is likely to have larger variation in electric characteristics and lower reliability than a transistor including a CAAC-OS film.

Next, a microcrystalline oxide semiconductor film is described.

In an image obtained with the TEM, crystal parts cannot be usually found clearly in the microcrystalline oxide semiconductor. In most cases, a crystal part in the microcrystalline oxide semiconductor is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as an nc-OS (nanocrystalline oxide semiconductor) film.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. Further, there is no regularity of crystal orientation between different crystal parts in the nc-OS film; thus, the whole film does not have a certain orientation. Accordingly, in some cases, the nc-OS film cannot be distinguished from an amorphous oxide semiconductor depending on an analysis method. For example, when the nc-OS film is subjected to structural analysis by an out-of-plane method with an XRD apparatus using an X-ray having a diameter larger than that of a crystal part, a peak which shows a crystal plane does not appear. Further, a diffraction pattern like a halo pattern appears in a selected-area electron diffraction pattern of the nc-OS film which is obtained by using an electron beam having a probe diameter (e.g., larger than or equal to 50 nm) larger than the diameter of a crystal part. Meanwhile, spots are observed in a nanobeam electron diffraction pattern of the nc-OS film obtained by using an electron beam having a probe diameter close to or smaller than the diameter of a crystal part. Further, in a nanobeam electron diffraction pattern of the nc-OS film, a plurality of circumferentially distributed spots are observed (see FIG. 20B).

The nc-OS film is an oxide semiconductor film that has high regularity as compared to an amorphous oxide semiconductor film. Therefore, the nc-OS film has a lower density of defect states than an amorphous oxide semiconductor film. As mentioned above, there is no regularity of crystal orientation between different crystal parts in the nc-OS film. Therefore, the nc-OS film has a higher density of defect states than the CAAC-OS film.

Accordingly, the nc-OS film is likely to have higher carrier density than the CAAC-OS film. An oxide semiconductor film with a high carrier density tends to have a high electron mobility. Therefore, a transistor using the nc-OS film generally has a high field-effect mobility. The nc-OS film has a higher density of defect states than the CAAC-OS film, and thus may have a number of carrier traps. Consequently, a transistor using the nc-OS film has larger variation in electric characteristics and lower reliability than a transistor including the CAAC-OS film. Note that the nc-OS film can be obtained even when the amount of impurity contained therein is relatively large; thus, the nc-OS film is preferably used depending on the application. Therefore, a semiconductor device including the transistor including the nc-OS film can be manufactured with high productivity.

Next, an amorphous oxide semiconductor film is described.

The amorphous oxide semiconductor film has disordered atomic arrangement without crystalline part and possesses an amorphous region as quartz.

In an image obtained with TEM, a crystal part cannot be detected in the amorphous oxide semiconductor film.

When the amorphous oxide semiconductor film is subjected to structural analysis by an out-of-plane method with an XRD apparatus, a peak which shows a crystal plane does not appear. A halo pattern is shown in an electron diffraction pattern of the amorphous oxide semiconductor film. Further, a halo pattern is shown but a spot is not shown in a nanobeam electron diffraction pattern of the amorphous oxide semiconductor film.

The amorphous oxide semiconductor film contains impurities such as hydrogen at a high concentration. In addition, the amorphous oxide semiconductor film has a high density of defect states.

The oxide semiconductor film having a high impurity concentration and a high density of defect states has many carrier traps or many carrier generation sources.

Accordingly, the amorphous oxide semiconductor film has much higher carrier density than the nc-OS film. Therefore, a transistor including the amorphous oxide semiconductor film tends to be normally on. Thus, in some cases, such an amorphous oxide semiconductor layer can be applied to a transistor which needs to be normally on. The amorphous oxide semiconductor film contains an increased number of carrier traps due to its high density of defect state. Consequently, a transistor including the amorphous oxide semiconductor film has larger variation in electric characteristics and lower reliability than a transistor including the CAAC-OS film or the nc-OS film.

Next, a single-crystal oxide semiconductor film is described.

The single-crystal oxide semiconductor film has a lower impurity concentration and a lower density of defect states (few oxygen vacancies). Thus, the carrier density can be decreased. Accordingly, a transistor including the single-crystal oxide semiconductor film is unlikely to be normally on. Moreover, since the single-crystal oxide semiconductor film has a lower impurity concentration and a lower density of defect states, the number of carrier traps is small. Thus, the transistor including the single-crystal oxide semiconductor film has small variation in electric characteristics and accordingly has high reliability.

Note that when the oxide semiconductor film has few defects, the density thereof is increased. When the oxide semiconductor film has high crystallinity, the density thereof is increased. When the oxide semiconductor film has a lower concentration of impurities such as hydrogen, the density thereof is increased. The single-crystal oxide semiconductor film has higher density than the CAAC-OS film. The CAAC-OS film has higher density than the microcrystalline oxide semiconductor film. The polycrystalline oxide semiconductor film has higher density than the microcrystalline oxide semiconductor film. The microcrystalline oxide semiconductor film has higher density than the amorphous oxide semiconductor film.

<Crystal Structure Analysis by Nanobeam Electron Diffraction>

In the case where the oxide semiconductor film has a plurality of crystal structures, the use of nanobeam electron diffraction makes it possible to analyze the structure.

Figure 20A:
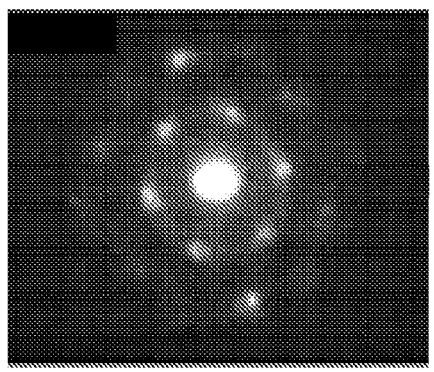
FIGS. 20A and 20B show nanobeam electron diffraction patterns of oxide semiconductor films and FIGS. 20C and 20D illustrate an example of a transmission electron diffraction measurement apparatus.
Figure 20B:
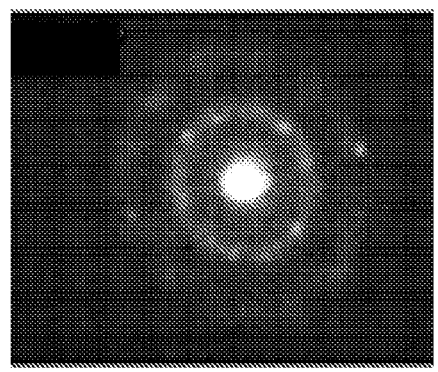
Figure 20C:
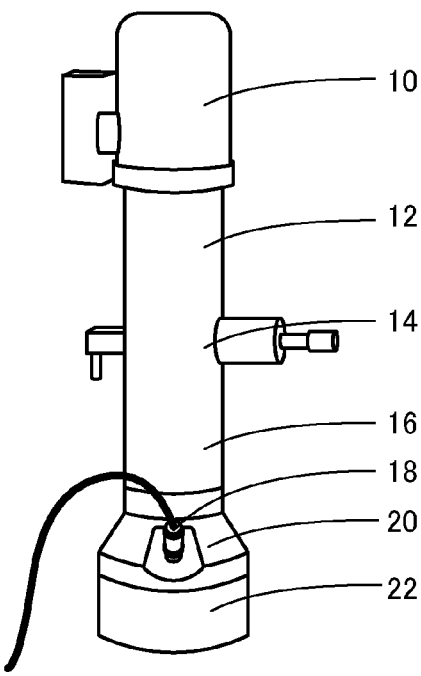

FIG. 20C illustrates a transmission electron diffraction measurement apparatus which includes an electron gun chamber 10, an optical system 12 below the electron gun chamber 10, a sample chamber 14 below the optical system 12, an optical system 16 below the sample chamber 14, an observation chamber 20 below the optical system 16, a camera 18 installed in the observation chamber 20, and a film chamber 22 below the observation chamber 20. The camera 18 is provided to face toward the inside of the observation chamber 20. Note that the film chamber 22 is not necessarily provided.

Figure 20D:
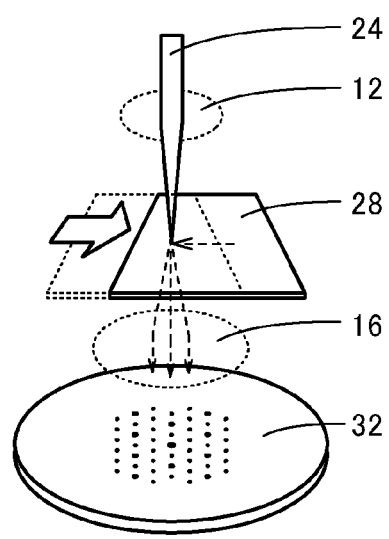

FIG. 20D illustrates an internal structure of the transmission electron diffraction measurement apparatus illustrated in FIG. 20C. In the transmission electron diffraction measurement apparatus, a sample 28 which is positioned in the sample chamber 14 is irradiated with electrons 24 emitted from an electron gun installed in the electron gun chamber 10 through the optical system 12. The electrons 24 which pass through the sample 28 enter a fluorescent plate 32 which is installed in the observation chamber 20 through the optical system 16. A pattern which depends on the intensity of the incident electrons appears in the fluorescent plate 32, so that the transmitted electron diffraction pattern can be measured.

The camera 18 is installed so as to face the fluorescent plate 32 and can take a picture of a pattern appearing in the fluorescent plate 32. An angle of a line passing through the center of a lens of the camera 18 and the center of the fluorescent plate 32 with respect to the direction of the electron beam is, for example, greater than or equal to 15° and less than or equal to 80°, greater than or equal to 30° and less than or equal to 75°, or greater than or equal to 45° and less than or equal to 70°. As the angle is increased, distortion of the transmission electron diffraction pattern taken by the camera 18 becomes larger. Note that it is possible to correct the distortion of the obtained electron diffraction pattern. Note that the film chamber 22 may be provided with the camera 18. For example, the camera 18 may be set in the film chamber 22 so as to be opposite to the incident direction of electrons 24. In this case, a transmission electron diffraction pattern with few distortion can be taken from the rear surface of the fluorescent plate 32.

A holder for fixing the sample 28 is provided in the sample chamber 14. The holder is configured to transmit electrons which pass through the sample 28. The holder may have a function of transferring or rotating the sample 28 along or about the x-axis, the y-axis, the z-axis. The holder may transfer the sample 28 in a distance of, for example, longer than or equal to 1 nm and shorter than or equal to 10 nm, longer than or equal to 5 nm and shorter than or equal to 50 nm, longer than or equal to 10 nm and shorter than or equal to 100 nm, longer than or equal to 50 nm and shorter than or equal to 500 nm, or longer than or equal to 100 nm and shorter than or equal to 1 μm. These ranges may be optimized depending on the structure of the sample 28.

A method for measuring a transmission electron diffraction pattern of a sample is described using the above-described transmission electron diffraction measurement apparatus.

For example, the measurement can be carried out while changing the irradiation position (scanning) of the electrons 24 as illustrated in FIG. 20D. When the sample 28 is a CAAC-OS film, a diffraction pattern as shown in FIG. 20A is observed. When the sample 28 is an nc-OS film, a diffraction pattern shown in FIG. 20B is observed.

Even in the case where the sample 28 is a CAAC-OS film, a region other than the CAAC region may be scanned with electrons 24 to give a diffraction pattern that is similar to that of an nc-OS film. Therefore, the population of the CAAC region in a film (also referred to as the proportion of CAAC) can be obtained. For example, in the case of a highly c-axis-aligned crystallized OS film, the proportion of CAAC reaches higher than or equal to 50%, higher than or equal to 80%, higher than or equal to 90%, higher than or equal to 95%. Note that a proportion of a region other than that of the CAAC region is referred to as the proportion of non-CAAC.

As an example, transmission electron diffraction patterns were obtained by scanning a sample of a CAAC-OS film obtained just after deposition (represented as "as-sputtered") and a sample of a CAAC-OS film subjected to heat treatment at 450° C. in an atmosphere containing oxygen. Here, the proportion of CAAC was derived in such a manner that a diffraction pattern was obtained by scanning the samples with electron beam for 60 seconds while moving the sample along the floor at a rate of 5 nm/second, and the observed diffraction pattern was changed into a still image every 0.5 seconds. A nanobeam with a probe diameter of 1 nm was used as the electron beam. The above measurement was performed on six samples. The proportion of CAAC was obtained using the average value of the six samples.

Figure 21A:
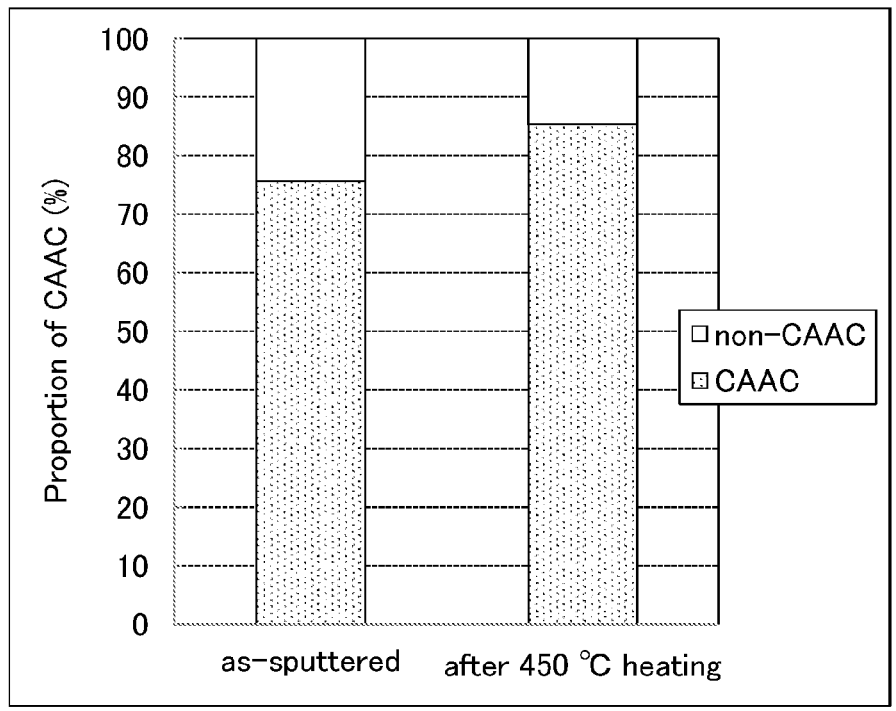
FIG. 21A shows a result of structural analysis by transmission electron diffraction measurement and FIGS. 21B and 21C show planar TEM images.

FIG. 21A shows the proportion of CAAC in each sample. The proportion of CAAC of the CAAC-OS film obtained just after the deposition was 75.7% (the proportion of non-CAAC was 24.3%). The proportion of CAAC of the CAAC-OS film subjected to the heat treatment at 450° C. was 85.3% (the proportion of non-CAAC was 14.7%). These results show that the proportion of CAAC obtained after the heat treatment at 450° C. is higher than that obtained just after the deposition. That is, heat treatment at a high temperature (e.g., higher than or equal to 400° C.) reduces the proportion of non-CAAC (increases the proportion of CAAC). Further, the above results also indicate that even when the temperature of the heat treatment is lower than 500° C., the proportion of CAAC can be improved.

Here, most of the diffraction patterns different from that of a CAAC-OS film were the same as that of an nc-OS film. Further, a diffraction pattern attributed to an amorphous state was not able to be observed in the measurement region. Therefore, the above results suggest that the region having the same structure as that of an nc-OS film is rearranged by the heat treatment, whereby the region is transformed into CAAC.

Figure 21B:
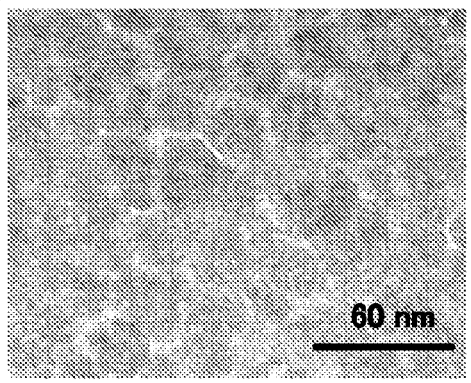
Figure 21C:
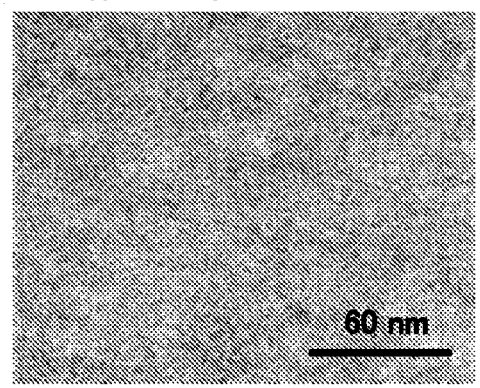

FIGS. 21B and 21C are planar TEM images of the CAAC-OS film obtained just after the deposition and the CAAC-OS film subjected to the heat treatment at 450° C., respectively. Comparison between FIGS. 21B and 21C shows that the CAAC-OS film subjected to the heat treatment at 450° C. has more uniform film quality. That is, the heat treatment improves the film quality of the CAAC-OS film.

Such a measurement method makes it possible to analyze the structure of an oxide semiconductor film having a plurality of structures.

<Formation Method of the CAAC-OS Film>

The CAAC-OS film can be formed by a sputtering method using a polycrystalline oxide semiconductor sputtering target. When ions collide with the sputtering target, a crystal region included in the sputtering target may be separated from the target along an a-b plane; in other words, a sputtered particle having a plane parallel to an a-b plane (flat-plate-like sputtered particle or pellet-like sputtered particle) may flake off from the sputtering target. In that case, the flat-plate-like sputtered particle reaches a substrate while maintaining their crystal state, whereby the CAAC-OS film can be formed.

The flat-plate-like sputtered particle may have an equivalent circle diameter of a plane parallel to the a-b plane of greater than or equal to 3 nm and less than or equal to 10 nm, and a thickness (length in the direction perpendicular to the a-b plane) of greater than or equal to 0.7 nm and less than 1 nm Note that the plane of the flat-plate-like sputtered particle parallel to the a-b plane may be a regular triangle or a regular hexagon. Here, the term "equivalent circle diameter of a plane" refers to the diameter of a perfect circle having the same area as the plane.

For the deposition of the CAAC-OS film, the following conditions are preferably used.

One of the conditions is increased temperature of the substrate. Specifically, the substrate temperature during the deposition is kept at a temperature higher than or equal to 100° C. and lower than or equal to 740° C., preferably higher than or equal to 200° C. and lower than or equal to 500° C. Increase in the substrate temperature during the deposition provides a following plausible mechanism for the formation of the CAAC-OS film. Specifically, when the flat-plate-like sputtered particles reach the substrate, migration occurs on the substrate surface, so that a flat plane of the sputtered particles is attached to the substrate. At this time, the sputtered particle is charged positively, whereby sputtered particles are attached to the substrate while repelling each other; thus, the sputtered particles do not overlap each other randomly, and a CAAC-OS film with a uniform thickness can be deposited.

Second, the amount of impurities entering the CAAC-OS layer during the deposition is reduced, by which the crystal state can be prevented from being broken by the impurities. For example, the concentration of impurities (e.g., hydrogen, water, carbon dioxide, or nitrogen) which exist in the deposition chamber may be reduced. Furthermore, the concentration of impurities in a deposition gas may be reduced. Specifically, a deposition gas whose dew point is −80° C. or lower, preferably −100° C. or lower is used.

Finally, the proportion of oxygen in the deposition gas is increased and the power is optimized, which allows the reduction of the plasma damage at the deposition. The proportion of oxygen in the deposition gas is higher than or equal to 30 vol %, preferably 100 vol %.

After the CAAC-OS film is deposited, heat treatment may be performed. The temperature of the heat treatment is higher than or equal to 100° C. and lower than or equal to 740° C., preferably higher than or equal to 200° C. and lower than or equal to 500° C. The heat treatment time is longer than or equal to 1 minute and shorter than or equal to 24 hours, preferably longer than or equal to 6 minutes and shorter than or equal to 4 hours. The heat treatment may be performed in an inert atmosphere or an oxidative atmosphere. It is preferable to perform heat treatment in an inert atmosphere and then perform heat treatment in an oxidative atmosphere. The heat treatment in an inert atmosphere can reduce the concentration of impurities in the CAAC-OS film for a short time. Note that the heat treatment in an inert atmosphere may generate oxygen vacancies in the CAAC-OS film. In such a case, the heat treatment in an oxidative atmosphere can be carried out to reduce the oxygen vacancies. The heat treatment can further increase the crystallinity of the CAAC-OS film. Note that the heat treatment may be performed under a reduced pressure, such as 1000 Pa or lower, 100 Pa or lower, 10 Pa or lower, or 1 Pa or lower. The heat treatment under the reduced pressure can reduce the concentration of impurities in the CAAC-OS film for a shorter time.

In the heat treatment, a heating mechanism utilizing a resistance heater, a lamp, or the like or a heating mechanism utilizing heat conduction from a medium such as a heated gas, such as rapid thermal annealing (RTA) such as gas rapid thermal annealing (GRTA) or lamp rapid thermal annealing (LRTA) can be used. The LRTA apparatus is an apparatus for heating an object by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. In the GRTA apparatus, heat treatment is performed using a high-temperature gas. An inert gas is used as a gas. With the RTA apparatus, the process time can be shortened and thus the RTA apparatus is preferred for mass production. Alternatively, an in-line heating apparatus may be used in the heat treatment.

As an example of the sputtering target, an In—Ga—Zn oxide target is described below.

The In—Ga—Zn oxide target, which is polycrystalline, is prepared by mixing $InO_X$ powder, $GaO_Y$ powder, and $ZnO_Z$ powder, applying pressure, and performing heat treatment at a temperature higher than or equal to 1000° C. and lower than or equal to 1500° C. Note that X, Y, and Z are each a positive number. Here, the molar ratio in mixing the $InO_X$ powder, $GaO_Y$ powder, and $ZnO_Z$ powder is, for example, 2:2:1, 8:4:3, 3:1:1, 1:1:1, 4:2:3, 1:1:2, 3:1:4, 1:3:1, 1:3:2, 1:3:4, 1:6:2, 1:6:4, 1:6:5, 1:6:8, or 3:1:2. The kinds of powder and the molar ratio may be determined as appropriate depending on a composition of the deposited film.

Alternatively, the CAAC-OS film is formed by the following method.

First, a first oxide semiconductor film is formed to a thickness of greater than or equal to 1 nm and less than 10 nm. The first oxide semiconductor film is formed by a sputtering method. Specifically, the substrate temperature is set to higher than or equal to 100° C. and lower than or equal to 500° C., preferably higher than or equal to 150° C. and lower than or equal to 450° C., and the proportion of oxygen in a deposition gas is set to higher than or equal to 30 vol %, preferably 100 vol %.

Next, the aforementioned heat treatment is performed so that the first oxide semiconductor film is transformed to a first CAAC-OS film with high crystallinity.

The first oxide semiconductor film can be crystallized easier in the case where the thickness is greater than or equal to 1 nm and less than 10 nm than in the case where the thickness is greater than or equal to 10 nm.

Next, a second oxide semiconductor film having the same composition as the first oxide semiconductor film is formed to a thickness of greater than or equal to 10 nm and less than or equal to 50 nm. The second oxide semiconductor film is formed by a sputtering method. Specifically, the substrate temperature is set to higher than or equal to 100° C. and lower than or equal to 500° C., preferably higher than or equal to 150° C. and lower than or equal to 450° C., and the proportion of oxygen in a deposition gas is set to higher than or equal to 30 vol %, preferably 100 vol %.

Next, heat treatment is performed so that solid phase growth of the second oxide semiconductor film proceeds using the first CAAC-OS film, thereby forming a second CAAC-OS film with high crystallinity. The heat treatment can be carried out as described above.

As described above, a CAAC-OS film with a total thickness of greater than or equal to 10 nm can be formed. The CAAC-OS film can be favorably used as the oxide semiconductor layer in the oxide stack.

The oxide semiconductor film obtained by such a formation method has high crystallinity even when being provided over, for example, an amorphous surface, an amorphous insulating surface, or an amorphous oxide surface.

<Formation Method of an Oxide Film Having Other Morphology>

For example, in the case where a formation surface is at a low temperature (e.g., a temperature lower than 130° C., lower than 100° C., or lower than 70° C., or about a room temperature (higher than or equal to 20° C. and lower than or equal to 25° C.)), sputtered particles are irregularly deposited. This is because migration of the deposited particle does not occur. The sputtered particles are further accumulated thereover, which may lead to the uneven thickness and the disordered crystal alignment of the resulted oxide film. The oxide film obtained in the above manner maintains the crystallinity originating from the sputtered particles to a certain degree and thus has a crystal part (nanocrystal).

For example, in the case where the pressure at the deposition is high, the collision frequency of the sputtered particle that is released with another particle (e.g., an atom, a molecule, an ion, or a radical) of argon or the like is increased. The collision with another particles promotes decomposition of the crystal structure, and the particles cannot maintain the plate-like shape, leading to the fragmentation (atomized state). When atoms fragmented from the sputtered particle are deposited on the formation surface, an amorphous oxide semiconductor film is formed.

In the case where not a sputtering method using a target including polycrystalline oxide but a deposition method using liquid or a method for depositing a film by vaporizing a solid such as a target is used, the atoms separately fly to be deposited over the formation surface; therefore, an amorphous oxide film might be formed. Further, for example, by a laser ablation method, atoms, molecules, ions, radials, clusters, or the like released from the target flies to be deposited over the formation surface; therefore, an amorphous oxide film might be formed.

Modification Example

A modification example of the transistor 100 illustrated in FIGS. 1A and 1B is described below.

Modification Example 1

Figure 5A:
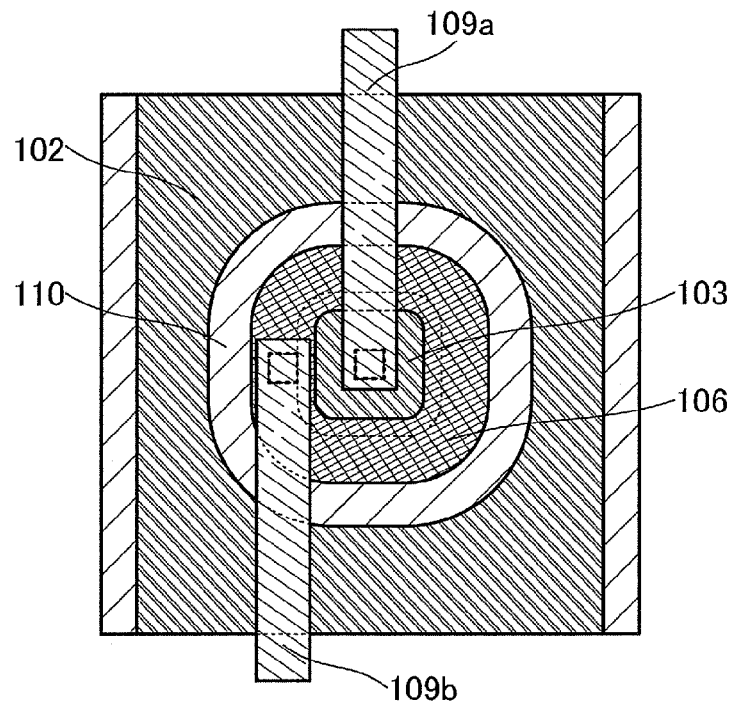
FIGS. 5A and 5B each illustrate a structural example of a transistor of an embodiment.
Figure 5B:
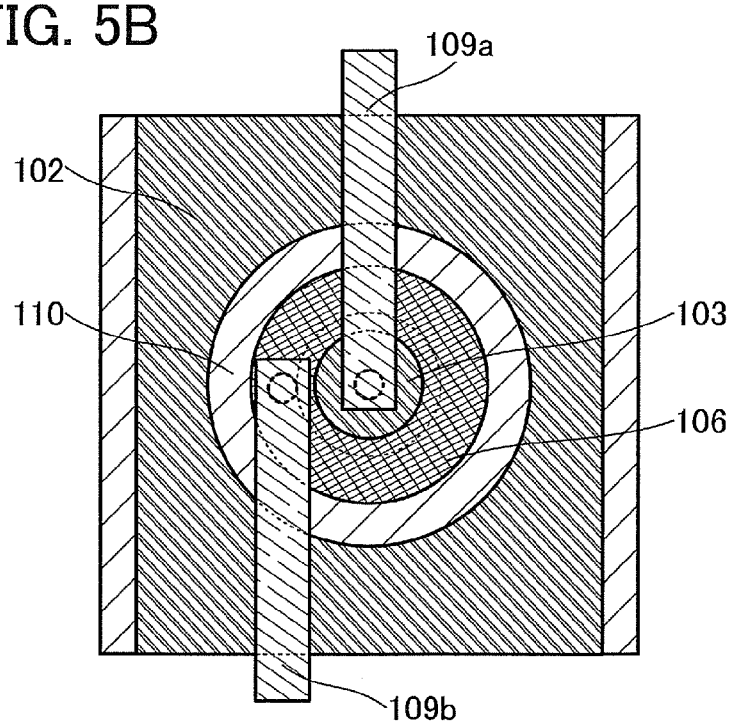

FIGS. 5A and 5B are each a schematic top view of a transistor described in this modification example.

As illustrated in FIG. 5A, corners of the outer periphery of the second electrode 103, corners of the inner periphery and outer periphery of the gate electrode 106, and corners of the inner periphery of the first electrode 102 may have an arc shape. Alternatively, as illustrated in FIG. 5B, the shapes of the outer peripheries and the inner peripheries of these electrodes may be circular. Such shapes of the first electrode 102, the second electrode 103, and the gate electrode 106 allow the channel length of the transistor to be even; accordingly, electrical characteristic variation can be reduced.

Modification Example 2

Figure 6:
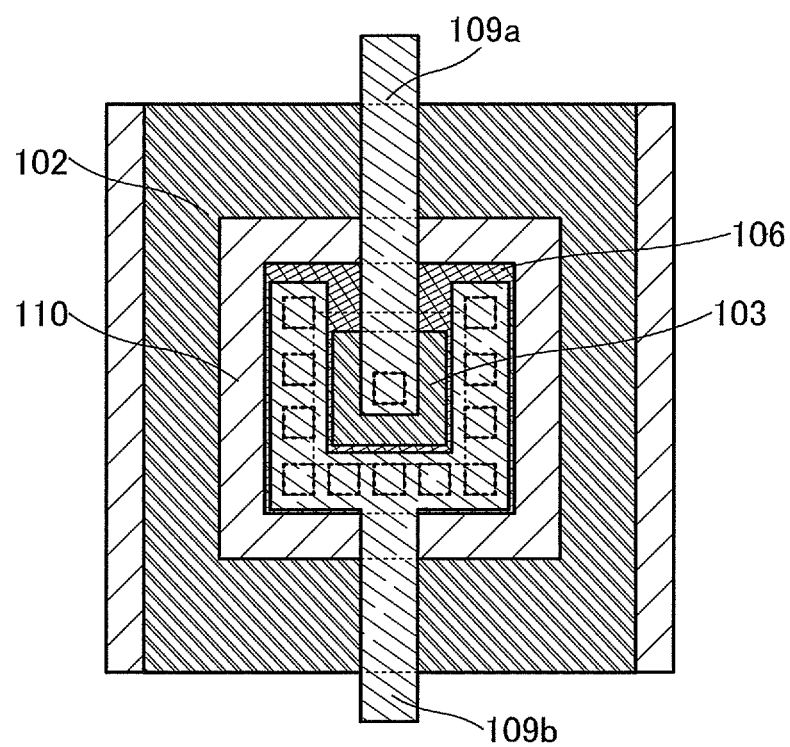
FIG. 6 illustrates a structural example of a transistor of an embodiment.

FIG. 6 is a schematic top view of a transistor described in this modification example.

As illustrated in FIG. 6, the electrode 109b and the gate electrode 106 may be electrically connected to each other through a plurality of opening portions. Such a structure can reduce the series resistance between the electrode 109b and the gate electrode 106.

Modification Example 3

Figure 7A:
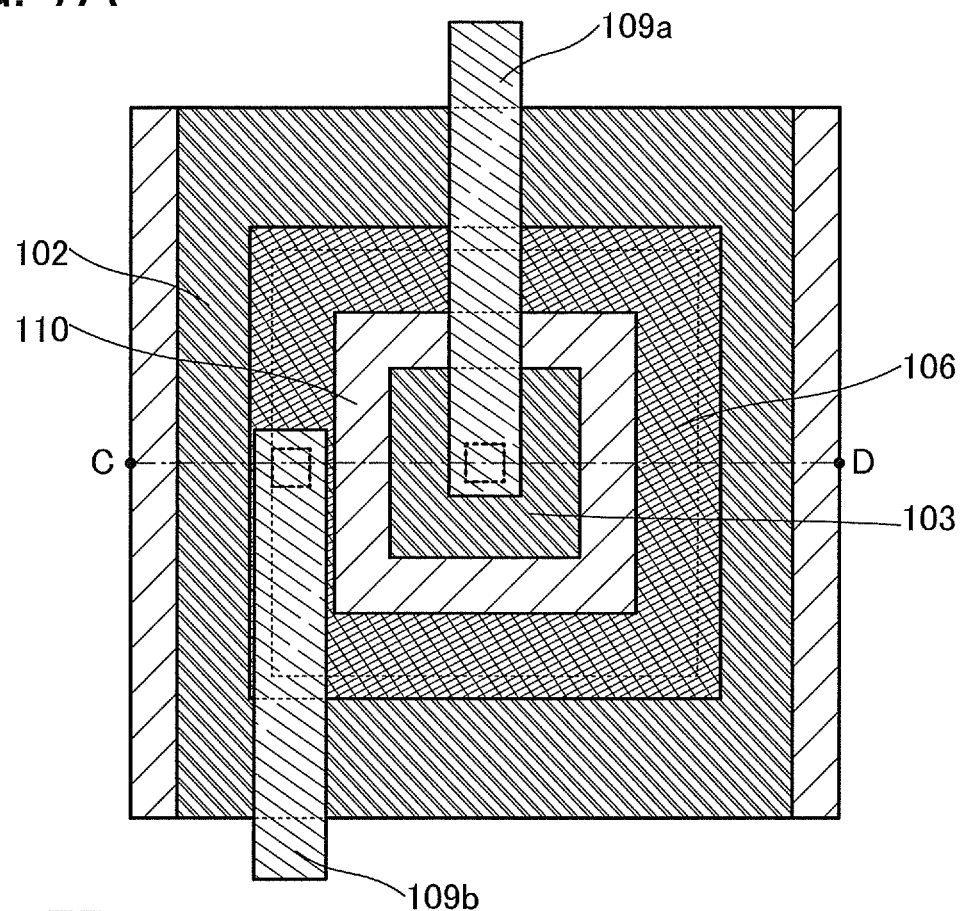
FIGS. 7A and 7B illustrate a structural example of a transistor of an embodiment.
Figure 7B:
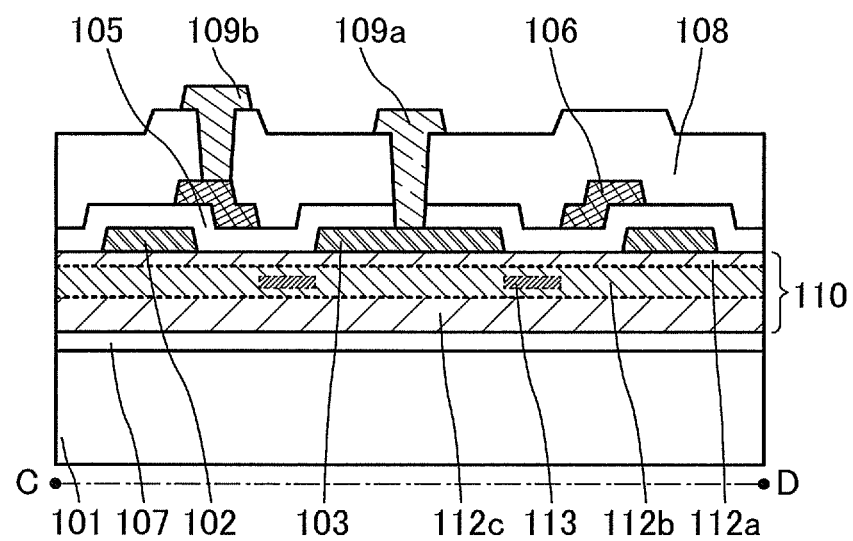

FIG. 7A is a schematic top view of a transistor described in this modification example, and FIG. 7B is a schematic cross-sectional view taken along line C-D in FIG. 7A. The transistor described here is different from the transistor illustrated in FIGS. 1A and 1B mainly in the positional relationship between the gate electrode 106 and the first and second electrodes (102 and 103).

The ring-shaped gate electrode 106 is provided to overlap part of the first electrode 102 and part of the oxide stack 110. Specifically, the inner edge portion of the ring-shaped gate electrode 106 overlaps the oxide stack 110 and the outer edge portion thereof overlap the first electrode 102. Therefore, an offset region where the gate electrode 106 and the oxide stack 110 do not overlap with each other is formed on the second electrode 103 side.

In the transistor illustrated in FIGS. 7A and 7B, the first electrode 102 functions as a source electrode and the second electrode 103 functions as a drain electrode. In this manner, the function of the source and the function of the drain may be inverted from those of the transistor 100 illustrated in FIGS. 1A and 1B.

Modification Example 4

Figure 8:
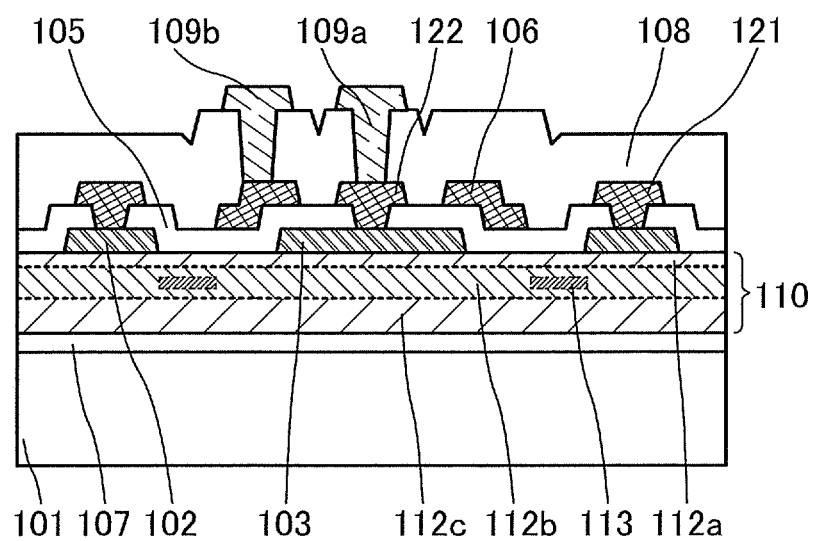
FIG. 8 illustrates a structural example of a transistor of an embodiment.

FIG. 8 is a schematic cross-sectional view of a transistor described in this modification example.

The transistor illustrated in FIG. 8 includes, over the gate insulating layer 105, electrodes 121 and 122 that are formed using the same conductive material as the gate electrode 106.

The electrode 121 is electrically connected to the first electrode 102 through an opening portion in the gate insulating layer 105. When the electrode 121 is provided, wiring resistance of the first electrode 102 can be reduced, and thus larger current can flow.

The electrode 122 is provided between the second electrode 103 and the electrode 109a and electrically connected thereto. Such a structure is preferable because the gate insulating layer 105 does not need to be etched at the same time as formation of an opening portion in the insulating layer 108 and thus flexibility of processing conditions is increased.

Modification Example 5

Figure 9A:
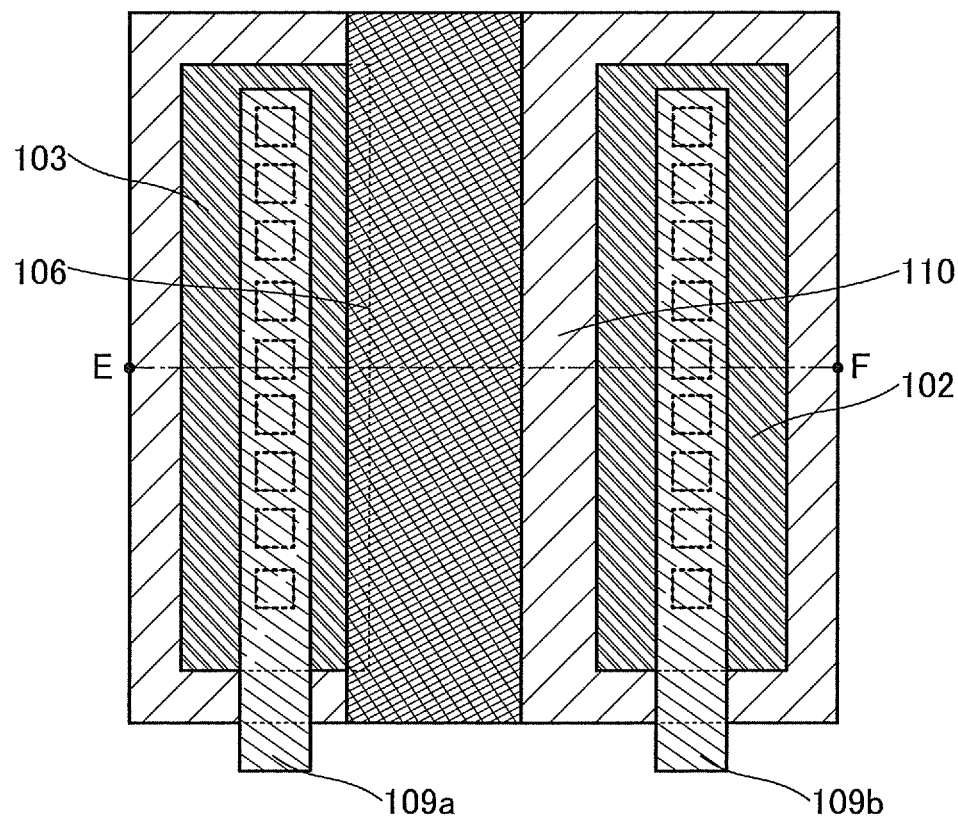
FIGS. 9A and 9B illustrate a structural example of a transistor of an embodiment.
Figure 9B:
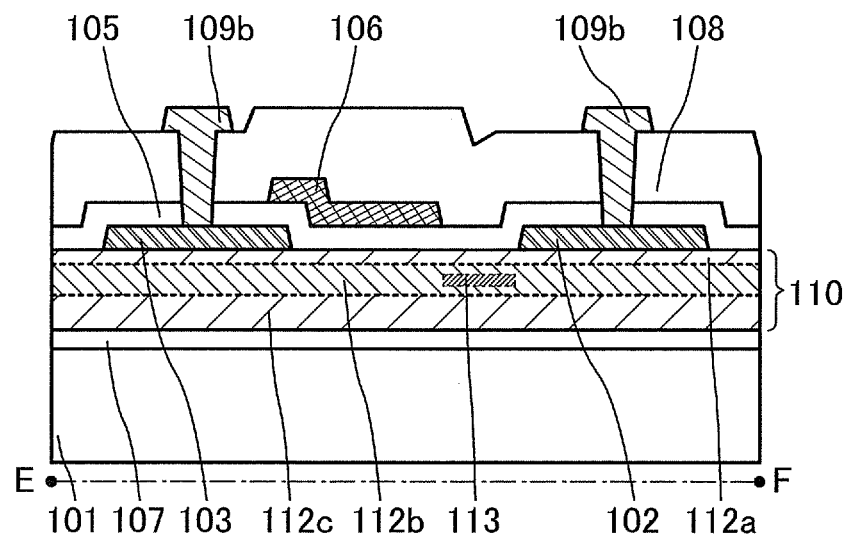

FIG. 9A is a schematic top view of a transistor described in this modification example, and FIG. 9B is a schematic cross-sectional view taken along line E-F in FIG. 9A.

The transistor illustrated in FIGS. 9A and 9B has a structure in which a first electrode 102 functioning as a drain electrode and a second electrode 103 functioning as a source electrode are provided to face each other and to be parallel to each other. One edge of the gate electrode 106 overlaps the second electrode 103 and the other edge thereof overlaps the oxide stack 110 without the first electrode 102 therebetween. Therefore, an offset region where the gate electrode 106 does not overlap the oxide stack 110 is provided on the first electrode 102 side.

Although the edge portion of the oxide stack 110 is not illustrated in FIGS. 9A and 9B, the oxide stack 110 may be processed into an island shape.

The above is the description of the modification example.

Application Example

Figure 10:
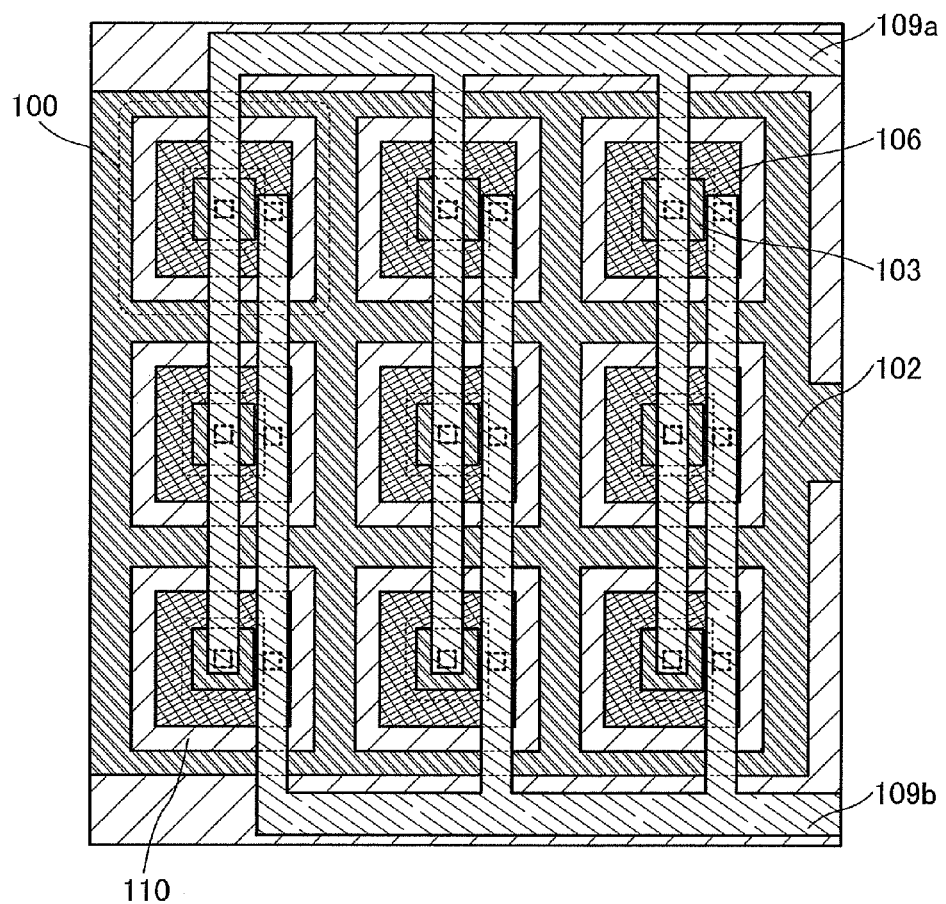
FIG. 10 illustrates a structural example of a transistor of an embodiment.

FIG. 10 is a schematic cross-sectional view showing an application example in which a plurality of transistors 100 described in FIGS. 1A and 1B are provided to be connected in parallel to each other.

In FIG. 10, nine transistors 100 are provided in a matrix of three rows and three columns. Note that the number and the arrangement of the transistors 100 are not limited to those explained here, and the transistors are not necessarily provided in a matrix.

The first electrode 102 that is shared by the plurality of transistors 100 includes a plurality of opening portions, and the second electrode 103 is provided in the opening portions. The electrode 109a is electrically connected to each of the second electrodes 103 of the transistors 100. The electrode 109b is electrically connected to each of the gate electrodes 106 of the transistors 100.

Such parallel connection of the plurality of transistors 100 enables larger current to flow. Further, as illustrated in FIG. 10, the structure in which the plurality of transistors 100 are provided over one substrate can reduce the size of the final form (e.g., a molded chip).

FIG. 10 illustrates the structure in which the oxide stack 110 is not divided between the transistors 100, and one continuous oxide stack 110 is shared by the transistors 100; however, the oxide stack 110 may be processed into island shapes so that the oxide stack 110 is divided between the transistors 100.

The above is the description of this application example.

This embodiment can be implemented in combination with any of the other embodiments described in this specification as appropriate.

Embodiment 2

In this embodiment, an example of a method for manufacturing the transistor described in Embodiment 1 is described.

Manufacturing Method Example

An example of a method for manufacturing the transistor 100 described in Embodiment 1 is described with reference to FIGS. 11A to 11D and FIGS. 12A and 12B. FIGS. 11A to 11D and FIGS. 12A and 12B are cross-sectional views of the manufacturing process.

<Formation of Insulating Layer 107>

First, the insulating layer 107 is formed over the substrate 101.

As the substrate 101, a substrate which is resistant to heat in the manufacturing process is used. For example, a glass substrate, a metal substrate, an alloy substrate, a single crystal semiconductor substrate of silicon, silicon carbide, or the like can be used. Alternatively, a substrate in which a device such as another transistor is formed on the substrate 101 may be used. In this case, the device may be formed so as to be electrically connected to at least one of the first electrode 102, the second electrode 103, and the gate electrode 106 of the transistor 100.

In the case where heat resulting from the large current flowing in the transistor causes a problem, a material having high thermal conductivity is preferably used for the substrate 101. For example, a metal substrate, an alloy substrate, a semiconductor substrate, or the like can be used.

Note that, after elements including the transistor 100 and circuits are formed on the substrate 101, the elements and the circuits may be separated to be attached to another substrate. Examples of the substrate include a plastic substrate formed of poly(vinyl fluoride) (PVF), a polyester, an acrylic resin, or the like and a substrate of fiberglass-reinforced plastics (FRP). Such a substrate is preferred because a large semiconductor device having a circuit including transistors can be folded The insulating layer 107 can be formed by a plasma chemical vapor deposition (CVD) method, a sputtering method, or the like using an insulating film containing oxygen, such as an insulating film of aluminum oxide, magnesium oxide, silicon oxide, silicon oxynitride, gallium oxide, germanium oxide, yttrium oxide, zirconium oxide, lanthanum oxide, neodymium oxide, hafnium oxide, or tantalum oxide.

The insulating layer 107 has a function of supplying oxygen to the oxide stack 110 as well as a function of preventing diffusion of an impurity from the substrate 101; thus, an insulating layer containing oxygen is preferably used as the insulating layer 107. Note that in the case where the substrate 101 is a substrate where another device is formed as described above, the insulating layer 107 also has a function as an interlayer insulating layer. In that case, the insulating layer 107 is preferably subjected to planarization treatment such as chemical mechanical polishing (CMP) treatment so as to have a flat surface.

In the transistor 100 in this embodiment, the insulating layer 107 containing oxygen is provided below the stacked-layer structure (the oxide stack 110) including the oxide semiconductor layers. With such a structure, oxygen in the insulating layer 107 can be supplied to the channel formation region. The insulating layer 107 preferably has a region containing oxygen in excess of the stoichiometric composition. When the insulating layer 107 contains excess oxygen, supply of oxygen to the channel formation region can be promoted.

Note that in this specification and the like, excess oxygen means oxygen which can migrate in an oxide semiconductor layer or an oxide layer such as silicon oxide, or silicon oxynitride, oxygen which exists in excess of the intrinsic stoichiometric composition, or oxygen having a function of filling Vo (oxygen vacancies) generated due to lack of oxygen.

In order to make the insulating layer 107 contain excess oxygen, the insulating layer 107 may be formed in an oxygen atmosphere, for example. Alternatively, the oxygen may be introduced into the insulating layer 107. Both the methods may be combined.

For example, when oxygen is introduced into the insulating layer 107 to form a region excessively containing oxygen, a gas including at least including any of oxygen radicals, oxygen atoms, and oxygen ions is introduced by an ion implantation method, an ion doping method, a plasma immersion ion implantation method, plasma treatment, or the like. As the gas, oxygen, dinitrogen monoxide, nitrogen dioxide, carbon dioxide, carbon monoxide, and the like can be used. Further, a rare gas may be included in the gas.

<Formation of Oxide Stack 110>

Next, the second oxide layer 112c, the oxide semiconductor layer 112b, and the first oxide layer 112a are sequentially stacked over the insulating layer 107 to form the oxide stack 110. The oxide stack 110 is deposited by a sputtering method, a chemical vapor deposition (CVD) method, a molecular beam epitaxy (MBE) method, an atomic layer deposition (ALD) method, or a pulsed laser deposition (PLD) method (see FIG. 11A).

Any of the materials described in Embodiment 1 can be used for the first oxide layer 112a, the oxide semiconductor layer 112b, and the second oxide layer 112c.

The first oxide layer 112a is preferably formed using an In—Ga—Zn oxide having an atomic ratio of In:Ga:Zn=1:1:1, 1:3:2, 1:6:4, or 1:9:6, or an oxide having a composition which is close to any of the above atomic ratios.

The oxide semiconductor layer 112b is preferably formed using an In—Ga—Zn oxide having an atomic ratio of In:Ga:Zn=1:1:1 or 3:1:2, or an oxide having a composition which is close to any of the above atomic ratios.

For example, the second oxide layer 112c is preferably formed using an In—Ga—Zn oxide having an atomic ratio of In:Ga:Zn=1:1:1, 1:3:2, 1:6:4, or 1:9:6, or an oxide having a composition which is close to any of the above atomic ratios.

Note that, the expression "the composition of an oxide containing In, Ga, and Zn at the atomic ratio, In:Ga:Zn=a:b:c (a+b+c=1), is close to the composition of an oxide containing In, Ga, and Zn at the atomic ratio, In:Ga:Zn=A:B:C (A+B+

C=1)" means that a, b, and c satisfy the following relation: $(a-A)^2+(b-B)^2+(c-C)^2 \leq r^2$, and r may be 0.05, for example.

Note that the composition of each of the layers is not limited to the above atomic ratios. The oxide semiconductor layer 112b preferably has a higher content of indium than the first oxide layer 112a and the second oxide layer 112c. In an oxide semiconductor, the s orbital of indium mainly contributes to carrier transfer, and when the content of indium in the oxide semiconductor is increased, overlap of the s orbitals is increased. Therefore, an oxide having a composition in which the proportion of indium is higher than that of gallium has higher mobility than an oxide having a composition in which the proportion of indium is equal to or lower than that of gallium. On the other hand, gallium exhibits large formation energy of an oxygen vacancy and thus is not likely to generate an oxygen vacancy as compared to indium. Therefore, an oxide having a high gallium content has stable characteristics.

Thus, with the use of an oxide having a high content of indium for the oxide semiconductor layer 112b, a transistor having high field-effect mobility can be obtained. In contrast, when an oxide having a high content of gallium is used for on a side of an interface with the insulating layer, the transistor can have higher reliability.

An oxide that can be used for the first oxide layer 112a, the oxide semiconductor layer 112b, and the second oxide layer 112c preferably contains at least indium (In) or zinc (Zn). Alternatively, both In and Zn are preferably contained. Specifically, it is preferable that the oxide semiconductor layer 112b contain indium because the carrier mobility of the transistor can be increased, and that the oxide semiconductor layer 112b contain zinc because a CAAC-OS film is formed easily. In order to reduce variation in electrical characteristics of the transistors including the oxide semiconductor layer, the oxide semiconductor layer preferably contains a stabilizer in addition to indium and zinc.

As a stabilizer, gallium (Ga), tin (Sn), hafnium (Hf), aluminum (Al), zirconium (Zr), and the like can be given. As another stabilizer, lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) can be given.

For example, any of the following can be used: indium oxide, tin oxide, zinc oxide, an In—Zn oxide, a Sn—Zn oxide, an Al—Zn oxide, a Zn—Mg oxide, a Sn—Mg oxide, an In—Mg oxide, an In—Ga oxide, an In—Ga—Zn oxide, an In—Al—Zn oxide, an In—Sn—Zn oxide, a Sn—Ga—Zn oxide, an Al—Ga—Zn oxide, a Sn—Al—Zn oxide, an In—Hf—Zn oxide, an In—La—Zn oxide, an In—Ce—Zn oxide, an In—Pr—Zn oxide, an In—Nd—Zn oxide, an In—Sm—Zn oxide, an In—Eu—Zn oxide, an In—Gd—Zn oxide, an In—Tb—Zn oxide, an In—Dy—Zn oxide, an In—Ho—Zn oxide, an In—Er—Zn oxide, an In—Tm—Zn oxide, an In—Yb—Zn oxide, an In—Lu—Zn oxide, an In—Sn—Ga—Zn oxide, an In—Hf—Ga—Zn oxide, an In—Al—Ga—Zn oxide, an In—Sn—Al—Zn oxide, an In—Sn—Hf—Zn oxide, and an In—Hf—Al—Zn oxide.

Note that as described in Embodiment 1 in detail, the materials are selected so that the first oxide layer 112a and the second oxide layer 112c have higher electron affinity than the oxide semiconductor layer 112b.

Note that the oxide stack 110 is preferably formed by a sputtering method. As a sputtering method, an RF sputtering method, a DC sputtering method, an AC sputtering method, or the like can be used. In particular, a DC sputtering method is preferably used because dust generated in the deposition can be reduced and the film thickness can be uniform.

Note that oxygen may be introduced into the second oxide layer 112c before formation of the oxide semiconductor layer 112b. By the oxygen introduction treatment, the second oxide layer 112c contains excess oxygen, so that oxygen can be supplied to the oxide semiconductor layer 112b by heat treatment in a later film formation step. As a result, oxygen vacancy in the oxide semiconductor layer 112b can be effectively reduced.

The preferable and typical dosage of oxygen which is added to the second oxide layer 112c is, in the case of using an ion implantation method, higher than or equal to $5 \times 10^{14}/\text{cm}^2$ and lower than or equal to $1 \times 10^{17}/\text{cm}^2$. It is preferable that the amount of oxygen which is added be large enough to enable a reduction in oxygen vacancy in the oxide semiconductor film which is to be formed later, and the dosage is typically $5 \times 10^{14}/\text{cm}^2$ or more, preferably $1 \times 10^{15}/\text{cm}^2$ or more. At the same time, the higher the amount of added oxygen, the longer the treatment time and the lower the productivity; thus, the dosage is preferably $1 \times 10^{17}/\text{cm}^2$ or less, further preferably $5 \times 10^{16}/\text{cm}^2$ or less, still further preferably $2 \times 10^{16}/\text{cm}^2$ or less.

Note that the second oxide layer 112c may become amorphous by the oxygen introduction treatment. In the oxide stack 110, the oxide semiconductor layer 112b is preferably a CAAC-OS films. Accordingly, the oxygen introduction treatment is preferably performed before formation of the oxide semiconductor layer 112b.

Heat treatment is preferably performed after the oxide stack 110 is formed. The heat treatment may be performed at a temperature higher than or equal to 250° C. and lower than or equal to 650° C., preferably higher than or equal to 300° C. and lower than or equal to 500° C., in an inert gas atmosphere, an atmosphere containing an oxidization gas at 10 ppm or more, or a reduced pressure state. Alternatively, the heat treatment may be performed in such a manner that heat treatment is performed in an inert gas atmosphere, and then another heat treatment is performed in an atmosphere containing an oxidization gas at 10 ppm or more, in order to compensate eliminated oxygen. By the heat treatment, the crystallinity of the oxide stack 110 including the oxide semiconductor layer 112b can be increased, and an impurity such as hydrogen or water can be removed from the insulating layer 107 and the oxide stack 110. The improvement in the crystallinity of the oxide semiconductor layer 112b improves the electrical characteristics of the transistor.

As the heat treatment for improving the crystallinity of the oxide stack 110, heat treatment using irradiation with an energy beam may be performed. A typical example of the energy beam is a laser beam, preferably a pulsed laser beam. This is because the substrate over which the oxide stack 110 is formed is not thermally damaged and the irradiation region of the laser beam can be heated to a temperature at which the region is instantly crystallized.

The laser beam preferably has a wavelength corresponding to an energy higher than the band gap of the oxide semiconductor contained in the oxide stack 110 so that the laser beam is absorbed by the oxide stack 110. An example of a light source of a laser beam having such a wavelength is an excimer laser. As the excimer laser, a XeCl (308 nm) laser, a KrF (248 nm) laser, an ArF (193 nm) laser, or the like can be used. The third harmonic of a YAG laser or the like may be used.

To process the oxide stack 110 into an island shape, an unnecessary portion is etched using a photolithography method after the deposition of the oxide stack 110. The process may be performed after formation of the second oxide layer 112c, after formation of the oxide semiconductor layer 112b, or after formation of the first oxide layer 112a. For example, first process may be performed after the second oxide layer 112c and the oxide semiconductor layer 112b are stacked to form an island-shaped stack thereof, and then the first oxide layer 112a may be formed to cover the stack. After that, second process may be performed to process the first oxide layer 112a into an island shape. When such process is performed, the side surface of the oxide semiconductor layer 112b is not exposed. Therefore, mixing of an impurity from the side surface or release of oxygen through the side surface can be prevented.

<Formation of First Electrode 102 and Second Electrode 103>

Next, a conductive film is formed over the oxide stack 110 and an unnecessary portion is etched to form the first electrode 102 and the second electrode 103.

As the material of the conductive film, a metal such as Al, Cr, Cu, Ta, Ti, Mo, or W, or an alloy containing any of these metals can be used. The conductive film can be formed by a sputtering method, or the like.

At the time of etching the conductive film, an upper portion of the oxide stack 110 might be etched, so that part of the first oxide layer 112a might be thinned or disappear. Therefore, the thickness of the first oxide layer 112a at the time of the formation is preferably set in consideration of the etching.

Then, heat treatment similar to the above-mentioned heat treatment may be performed.

<Formation of Gate Insulating Layer 105>

Figure 11A:
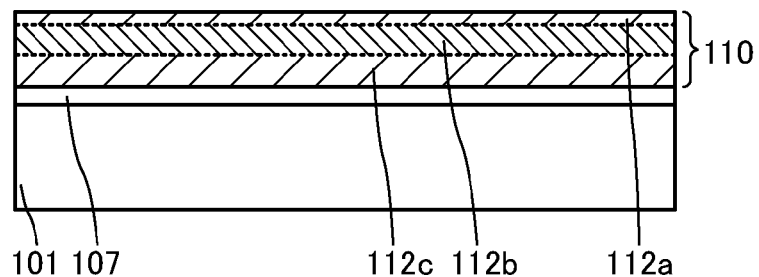
FIGS. 11A to 11D illustrate a method of manufacturing a transistor of an embodiment.
Figure 11B:
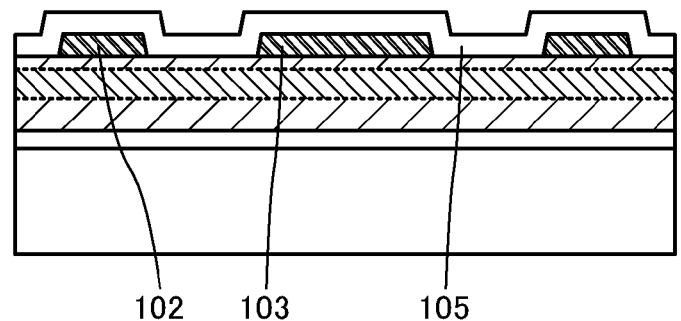

Then, the gate insulating layer 105 is formed over the oxide stack 110, the first electrode 102, and the second electrode 103 (see FIG. 11B).

As the material of the gate insulating layer 105, aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, or the like can be used. Note that the gate insulating layer 105 may be a stacked layer of any of the above materials. The gate insulating layer 105 can be formed by a sputtering method, a CVD method, an MBE method, an ALD method, a PLD method, or the like.

In a manner similar to the insulating layer 107, the gate insulating layer 105 plays not only a role of inhibiting diffusion of an impurity to the oxide stack 110 but also a role of supplying oxygen to the oxide stack 110, and is preferably formed using an insulating layer containing oxygen.

After the formation of the gate insulating layer 105, heat treatment may be performed. The heat treatment can be performed under the same conditions as those described above. By the heat treatment, oxygen is effectively supplied from the layers containing oxygen and surrounding the oxide stack 110 to the oxide stack 110, so that oxygen vacancy in the oxide semiconductor layer 112b can be reduced.

<Formation of Gate Electrode 106>

Figure 11C:
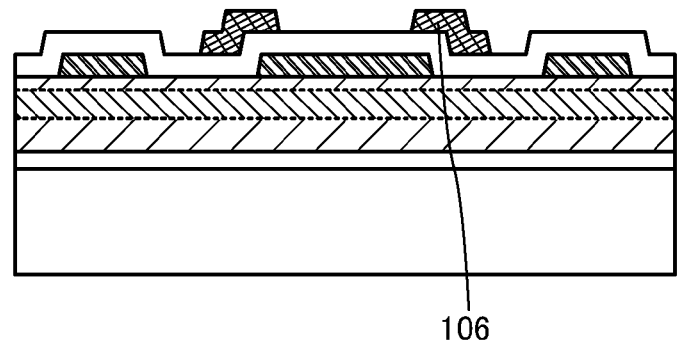
Figure 11D:
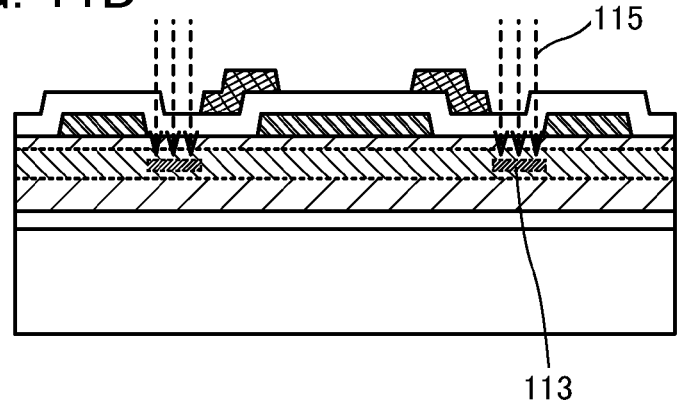

Next, a conductive film is formed over the gate insulating layer 105 and an unnecessary portion is etched to form the gate electrode 106 (see FIG. 11C).

As the material of the conductive film, a metal such as Al, Ti, Cr, Co, Ni, Cu, Y, Zr, Mo, Ru, Ag, Ta, or W, or an alloy material containing any of these metals. The conductive film can be formed by a sputtering method, or the like.

After the formation of the gate electrode 106, heat treatment may be performed. The heat treatment can be performed under the same conditions as those described above. By the heat treatment, oxygen is effectively supplied from the layers containing oxygen and surrounding the oxide stack 110 to the oxide stack 110, so that oxygen vacancy in the oxide semiconductor layer 112b can be reduced.

<Formation of Region 113>

Here, the oxide stack 110 possesses, between the first electrode 102 and the second electrode 103, a portion which is not covered with the gate electrode 106. That is, there is a portion between the first electrode 102 and the second electrode 103, which is not covered by the first electrode 102, the second electrode 103, nor and the gate electrode 106. An element 115 imparting conductivity to an oxide semiconductor is introduced into this portion, whereby the region 113 is formed in the oxide stack 110 (see FIG. 11D).

For example, the element 115 is added to the oxide stack 110 by an ion implantation method, an ion doping method, a plasma immersion ion implantation method, or the like. At this time, the first electrode 102, the second electrode 103, and the gate electrode 106 serve as shields; therefore, the element can be added to the portion in a self-aligned manner.

As the element 115, the element described in Embodiment 1 can be used. At this time, the added element 115 is in at least one of the following states: a radical, an atom, and an ion.

Here, the conditions for the addition of the element are preferably set so that the element 115 does not reach the interface between the oxide semiconductor layer 112b and the second oxide layer 112c. Further, it is preferred that a region having the highest concentration of the added element be located in the center portion of the oxide semiconductor layer 112b. More specifically, the element 115 is preferably introduced so that the region that has the highest concentration of the element 115 ranges from the surface of the oxide semiconductor layer 112b to a distance of 20 nm, preferably 10 nm, further preferably 5 nm. Alternatively, the element 115 is preferably introduced so that the region having the highest concentration of the element 115 ranges from the surface of the oxide semiconductor layer 112b to a distance corresponding to $3/4$, further preferably $1/2$, still further preferably $1/4$ of the thickness of the oxide semiconductor layer 112b.

The introduction of the element 115 using such a method enables formation of the region 113, which is an n-type region, in the oxide semiconductor layer 112b. Here, the portion of the oxide semiconductor layer 112b except the region 113 is preferably i-type or substantially i-type.

In this manner, the region 113 having increased conductivity can be formed in the oxide semiconductor layer 112b.

Note that after the region 113 is formed, irradiation with the above-described laser is preferably performed to increase the crystallinity of the oxide stack 110. The laser irradiation enables activation of elements which are added but do not contribute to conductivity. As a result, the conductivity can be further increased. The laser irradiation may not be necessarily performed on the whole of the substrate, but may be performed so that the regain to be treated is selectively irradiated. The layer irradiation may be also performed from the rear surface of the substrate 101 in the case where the substrate 101 transmits the laser.

Note that there is a case where oxygen is eliminated from the oxide semiconductor layer 112b depending on the laser irradiation conditions, and thus it is preferable that a region where the channel is formed (the region over which the gate electrode 106 is provided) be not subjected to laser irradiation.

After formation of the region 113, heat treatment may be performed. The heat treatment can be performed under conditions similar to those described above. The heat treatment can activate the element added to the region 113, which increases the conductivity of the region 113. Further, oxygen is effectively supplied from the layers, which surround the oxide stack 110 and contain oxygen, to the oxide stack 110 by the heat treatment, whereby oxygen vacancy in the oxide semiconductor layer 112b can be reduced.

<Formation of Insulating Layer 108>

Figure 12A:
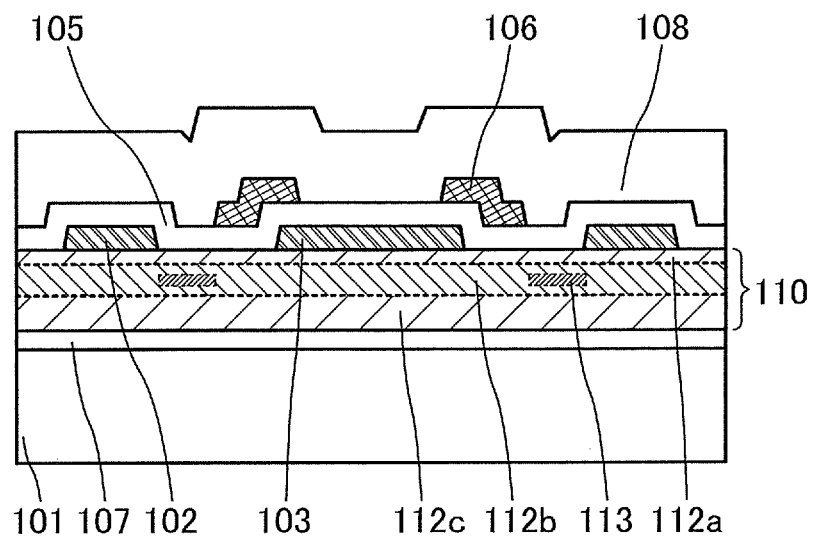
FIGS. 12A and 12B illustrate a method of manufacturing a transistor of an embodiment.

Next, the insulating layer 108 is formed over the gate insulating layer 105 and the gate electrode 106 (FIG. 12A).

The insulating layer 108 can be formed using a material and a method similar to those of the insulating layer 107 or the gate insulating layer 105.

Here, it is preferable that the insulating layer 108 include two layers, a layer containing oxygen (containing excess oxygen) which serves as a supply source of oxygen to the oxide stack 110 be provided on the oxide stack 110 side, and a layer having low oxygen permeability (having an oxygen barrier property) be provided over the layer. Examples of a material of the layer having low oxygen permeability include silicon nitride and silicon nitride oxide.

After the formation of the insulating layer 108, heat treatment may be performed. The heat treatment can be performed under the same conditions as those described above. By the heat treatment, oxygen is effectively supplied from the layers containing oxygen and surrounding the oxide stack 110 to the oxide stack 110, so that oxygen vacancy in the oxide semiconductor layer 112b can be reduced.

<Formation of Electrode 109a and Electrode 109b>

Next, the insulating layer 108 is selectively etched to form an opening portion reaching the gate electrode 106 and an opening portion reaching the second electrode 103.

Figure 12B:
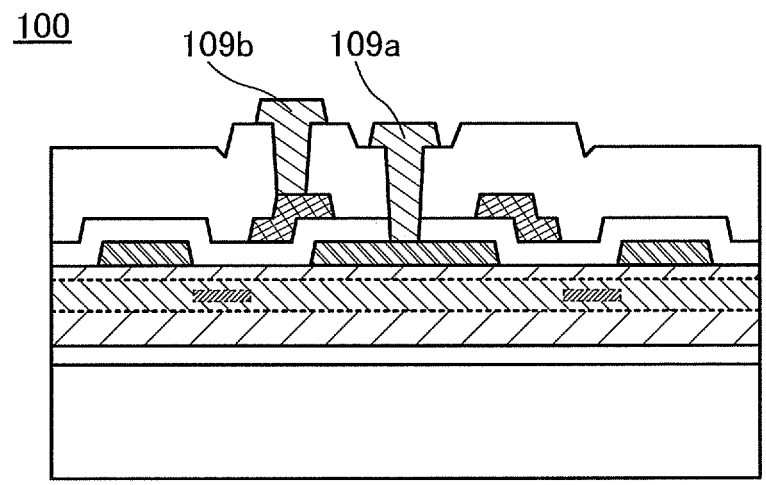

Then, a conductive film is formed over the insulating layer 108, and an unnecessary portion is removed by etching to form the electrode 109a and the electrode 109b (FIG. 12B).

As a material of the conductive film, any of the materials which can be used for the first electrode 102, the second electrode 103, and the gate electrode 106 can be used.

After formation of the electrode 109a and the electrode 109b, heat treatment may be performed. The heat treatment can be performed under conditions similar to those described above. Oxygen is effectively supplied from the layers, which surround the oxide stack 110 and contain oxygen, to the oxide stack 110 by the heat treatment, whereby oxygen vacancy in the oxide semiconductor layer 112b can be reduced.

Through the above process, the transistor 100 can be manufactured.

Modification Example

Although the addition of the element 115 for forming the region 113 is performed after formation of the gate electrode 106 in the above description, the formation of the region 113 can be performed at a different timing.

Figure 13A:
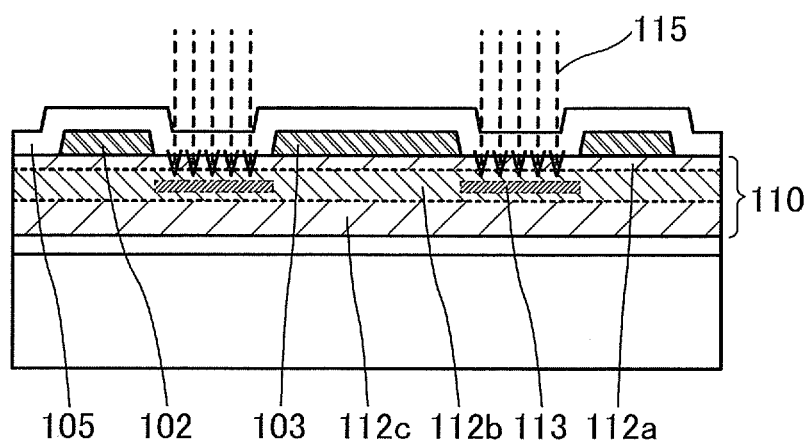
FIGS. 13A and 13B illustrate a method of manufacturing a transistor of an embodiment.

As illustrated in FIG. 13A, the addition of the element 115 may be performed after formation of the gate insulating layer 105 before formation of the gate electrode 106. At this time, the region 113 is formed at least in part of the oxide semiconductor layer 112b over which neither the first electrode 102 nor the second electrode 103 is provided.

Figure 13B:
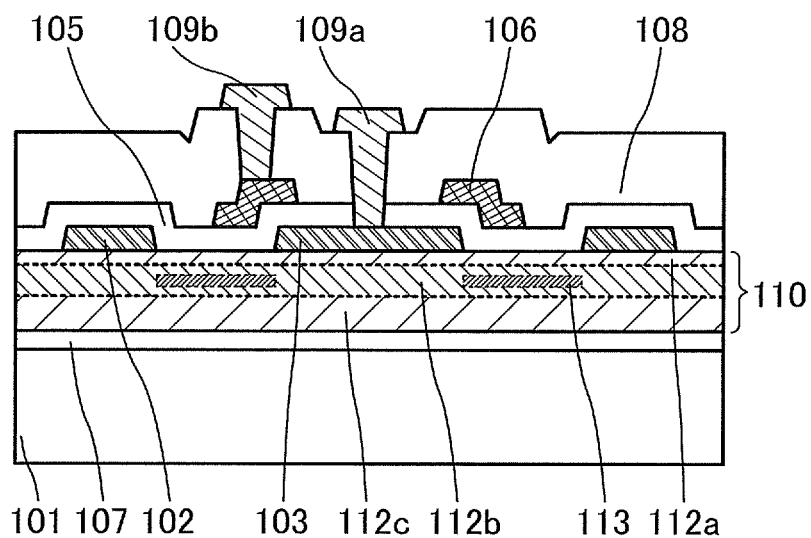

A cross-sectional view of the transistor formed in accordance with the example of the manufacturing method is illustrated in FIG. 13B. As illustrated in FIG. 13B, the region 113 is also formed in part of the oxide semiconductor layer 112b over which the gate electrode 106 is provided. Since the channel is mainly formed in the part, an increase in the conductivity of the part reduces the on-state resistance of the transistor. As a result, larger current can flow in the transistor.

The addition of the element 115 may be performed twice, i.e., at the timing after the gate insulating layer 105 is formed before the gate electrode 106 is formed, and at the timing after the gate electrode 106 is formed. As a result, the conductivity of the offset region in the vicinity of the drain can be further increased as compared to that described before.

Although the metal films, the semiconductor films, and the inorganic insulating films described in the above embodiments can be formed by a sputtering method or a plasma CVD method, such films may be formed by another method, e.g., a thermal CVD method. A metal organic chemical vapor deposition (MOCVD) method or an atomic layer deposition (ALD) method may be employed as a thermal CVD method.

A thermal CVD method has an advantage that defect due to plasma damage is negligibly generated since it does not utilize plasma for forming a film.

Deposition by a thermal CVD method may be performed in such a manner that a source gas and an oxidizer are supplied to a chamber at a time, the pressure in the chamber is set to an atmospheric pressure or a reduced pressure, and reaction is caused in the vicinity of a substrate or over the substrate.

Deposition by an ALD method may be performed in such a manner that the pressure in a chamber is set to an atmospheric pressure or a reduced pressure and a plurality of source gases for reaction are sequentially introduced into the chamber. For example, after a first source gas is introduce to the chamber and the film formation is completed, an inert gas (e.g., argon or nitrogen) is introduced, and then a second source gas is introduced to sequentially perform the film formation, by which mixing of a plurality of gases can be avoided. Note that the source gases may be introduced together with the inert gas as a carrier gas. Alternatively, the first source gas may be exhausted by vacuum evacuation instead of the introduction of the inert gas, and then the second source gas may be introduced. The first source gas is adsorbed on the surface of the substrate to form a first layer; then the second source gas is introduced to react with the first layer; as a result, a second layer is stacked over the first layer, so that a thin film is formed. The sequence of the gas introduction and the like is controlled and these steps are repeated plural times until a desired thickness is obtained, whereby a thin film with excellent ability to cover steps can be formed. The thickness of the thin film can be adjusted by the number of the film formation; therefore, an ALD method makes it possible to accurately adjust a film thickness and thus is suitable for manufacturing a minute FET.

The variety of films such as the metal film, the semiconductor film, and the inorganic insulating film which are disclosed in the embodiment can be formed by a thermal CVD method such as a MOCVD method or an ALD method. For example, in the case where an In—Ga—Zn—O film is formed, trimethylindium, trimethylgallium, and dimethylzinc are used. Triethylgallium and diethylzinc can be also used.

For example, in the case where a hafnium oxide film is formed by a deposition apparatus using an ALD method, two kinds of gases, i.e., ozone ($O_3$) as an oxidizer and a source gas which is obtained by vaporizing a solution of a hafnium precursor (a hafnium alkoxide and a hafnium amide such as hafnium tetrakis(dimethylamide) (TDMAH, Hf[N($CH_3$)$_2$]$_4$)). Examples of another precursor includes hafnium tetrakis(ethylmethylamide).

For example, in the case where an aluminum oxide film is formed using a deposition apparatus employing ALD, two kinds of gases, e.g., $H_2O$ as an oxidizer and a source gas which is obtained by vaporizing a solution of an aluminum precursor (e.g., trimethylaluminum) are used. Examples of another aluminum precursor include aluminum tris(dimethylamide), triisobutylaluminum, and aluminum tris(2,2,6,6-tetramethyl-3,5-heptanedionate).

For example, in the case where a silicon oxide film is formed by a deposition apparatus using an ALD method, hexachlorodisilane is adsorbed on a surface where a film is to be formed, chlorine contained in the adsorbate is removed, and radicals of an oxidizing gas (e.g., $O_2$ or dinitrogen monoxide) are supplied to react with the adsorbate.

For example, in the case where a tungsten film is formed using a deposition apparatus employing ALD, a $WF_6$ gas and a $B_2H_6$ gas are sequentially introduced plural times to form an initial tungsten film, and then a $WF_6$ gas and an $H_2$ gas are introduced at a time, so that a tungsten film is formed. Note that an $SiH_4$ gas may be used instead of a $B_2H_6$ gas.

For example, in the case where an oxide semiconductor film, e.g., an In—Ga—Zn—O film is formed using a deposition apparatus employing ALD, an trimethylindium gas and an $O_3$ gas are sequentially introduced to form an In—O layer, a trimethylgallium gas and an $O_3$ gas are sequentially introduced to form a GaO layer, and then a dimethylzinc gas and an $O_3$ gas are sequentially introduced to form a ZnO layer. Note that the order of these layers is not limited to this example. A mixed oxide layer such as an In—Ga—O layer, an In—Zn—O layer, or a Ga—Zn—O layer may be formed by using these gases. Note that the $O_3$ gas which does not include H is preferable. Additionally, an $H_2O$ gas which is obtained by bubbling with an inert gas such as Ar may be used instead of an $O_3$ gas. Also, a triethylindium gas or a trimethylgallium gas may be used.

This embodiment can be implemented in combination with any of the other embodiments described in this specification as appropriate.

Embodiment 3

In this embodiment, configuration examples of power converter circuits such as an inverter and an converter each including the transistor described in the above embodiment are described as an example of a semiconductor device that is one embodiment of the present invention.

[DC-DC Converter]

Figure 14A:
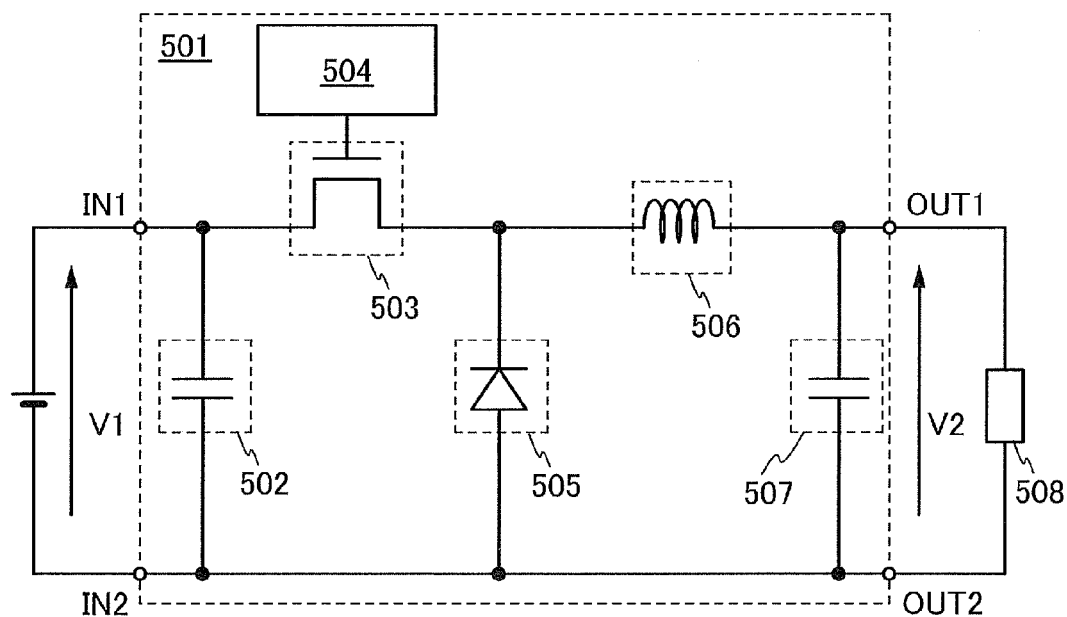
FIGS. 14A and 14B are structural examples of power converter circuits of an embodiment.

A DC-DC converter 501 in FIG. 14A is an example of a power convert and is a step-down DC-DC converter using a chopper circuit. The DC-DC converter 501 includes a capacitor 502, a transistor 503, a control circuit 504, a diode 505, a coil 506, and a capacitor 507.

The DC-DC converter 501 is operated by a switching operation of the transistor 503 with the control circuit 504. By the DC-DC converter 501, an input voltage V1 applied to input terminals IN1 and IN2 can be output from output terminals OUT1 and OUT2 to a load 508 as a voltage V2 which is stepped down. The semiconductor device described in the above embodiment can be applied to the transistor 503 included in the DC-DC converter 501. Therefore, large output current can flow through the DC-DC converter 501 by the switching operation, and off-state current can be reduced. Therefore, the DC-DC converter consumes less power and can operate at high speed.

Although the step-down DC-DC converter using a chopper circuit is shown in FIG. 14A as an example of a non-isolated power converter circuit, the semiconductor device described in the above embodiment can also be applied to a transistor included in a step-up DC-DC converter using a chopper circuit or a step-up/step-down DC-DC converter using a chopper circuit. Therefore, large output current can flow through the DC-DC converter by the switching operation, and off-state current can be reduced. Therefore, the DC-DC converter consumes less power and can operate at high speed.

Figure 14B:
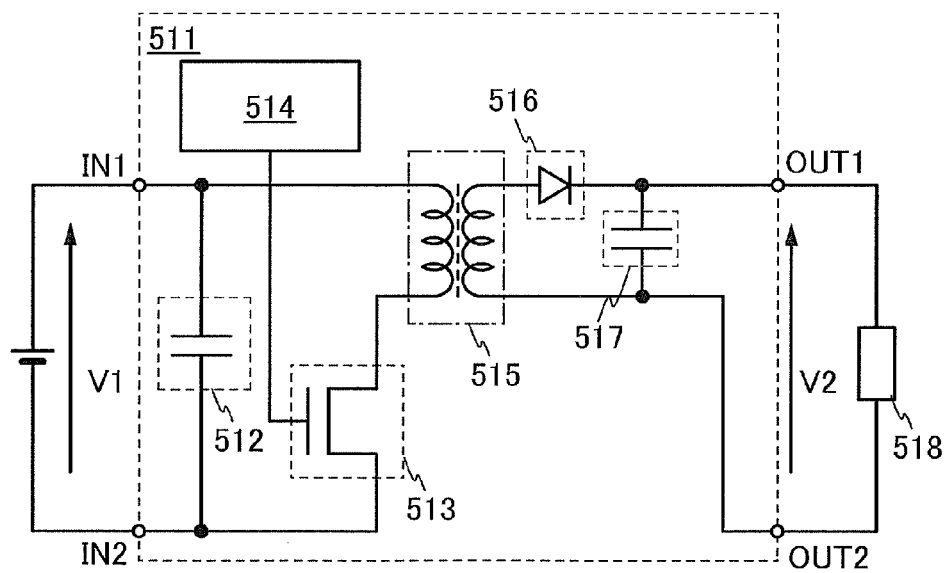

Next, a DC-DC converter 511 is illustrated in FIG. 14B as an example of a power converter, and an example of a circuit structure of a fly-back converter which is an isolated power converter circuit is shown here. The DC-DC converter 511 includes a capacitor 512, a transistor 513, a control circuit 514, a transformer 515 including a primary coil and a secondary coil, a diode 516, and a capacitor 517.

The DC-DC converter 511 in FIG. 14B is operated by a switching operation of the transistor 513 with the control circuit 514. By the DC-DC converter 511, an input voltage V1 applied to input terminals IN1 and IN2 can be output from output terminals OUT1 and OUT2 to a load 518 as a voltage V2 which is stepped up or stepped down. The semiconductor device described in the above embodiment can be applied to the transistor 513 included in the DC-DC converter 511. Therefore, large output current can flow through the DC-DC converter 511 by the switching operation, and off-state current can be reduced. Therefore, the DC-DC converter consumes less power and can operate at high speed.

Note that the semiconductor device described in the above embodiment can also be applied to a transistor included in a forward DC-DC converter.

Figure 15:
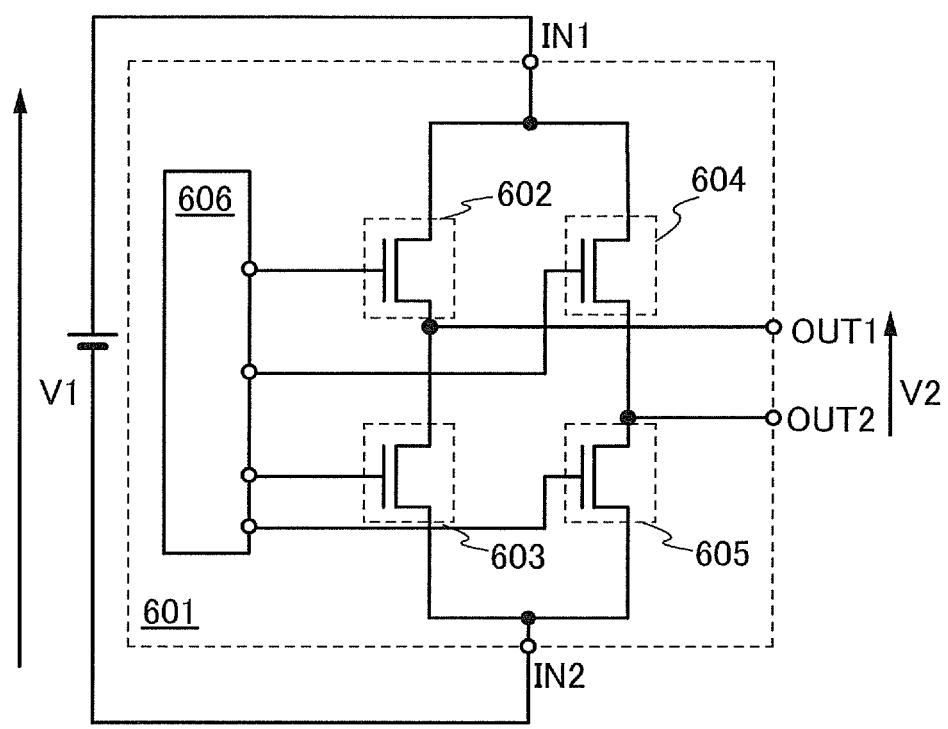
FIG. 15 is a structural example of a power converter circuit of an embodiment.

An inverter 601 in FIG. 15 is an example of a full-bridge inverter. The inverter 601 includes a transistor 602, a transistor 603, a transistor 604, a transistor 605, and a control circuit 606.

The inverter 601 in FIG. 15 is operated by a switching operation of the transistors 602 to 605 with the control circuit 606. A direct-current voltage V1 applied to input terminals IN1 and IN2 can be output from output terminals OUT1 and OUT2 as an alternating-current voltage V2. The semiconductor device described in the above embodiment can be applied to the transistors 602 to 605 included in the inverter 601. Therefore, large output current can flow through the inverter 601 by the switching operation, and off-state current can be reduced. Therefore, the inverter consumes less power and can operate at high speed.

This embodiment can be combined with any of the other embodiments disclosed in this specification as appropriate.

Embodiment 4

In this embodiment, a configuration example of a power supply circuit including the transistor described in the above embodiment is described as an example of a semiconductor device of one embodiment of the present invention.

Figure 16:
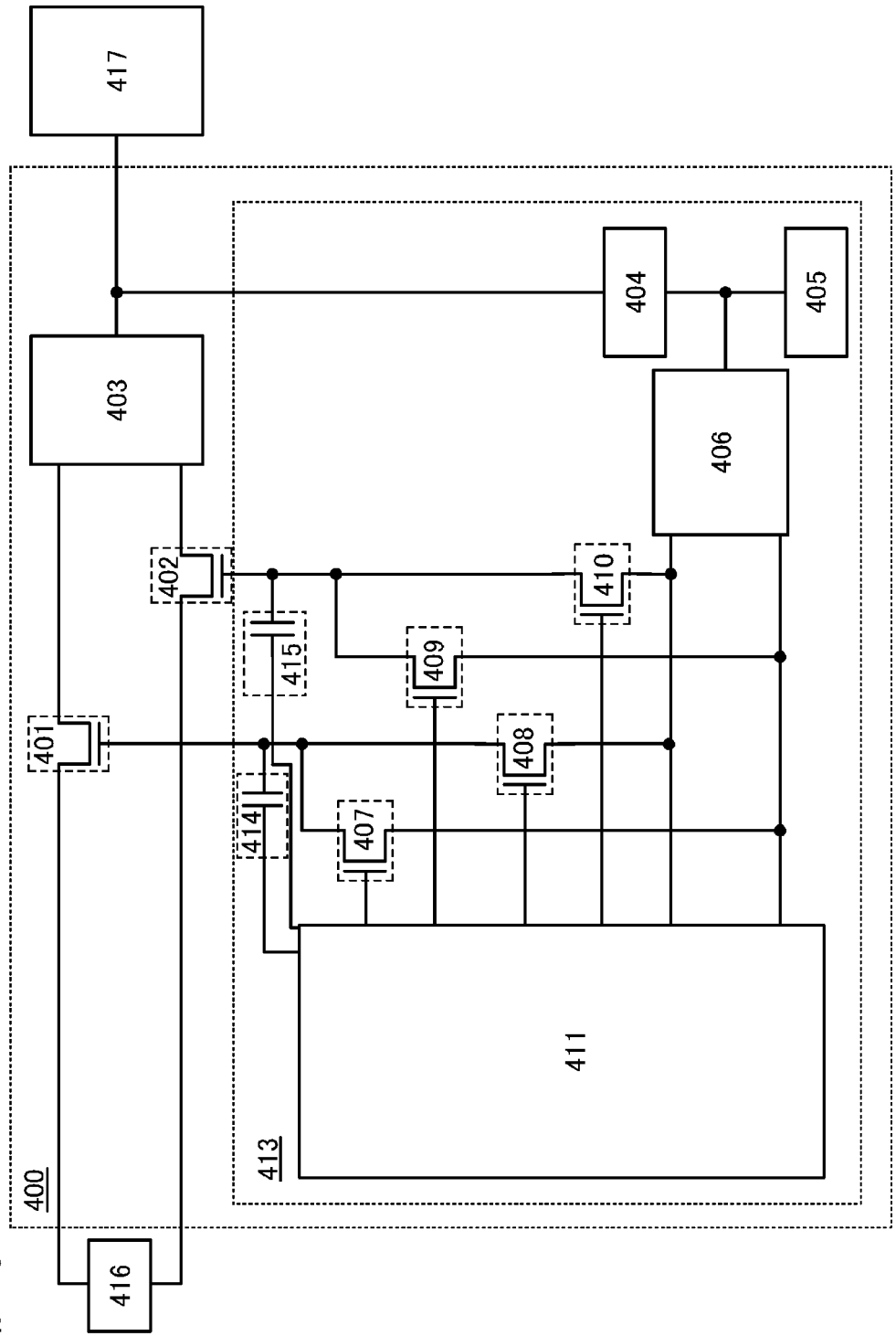
FIG. 16 is a structural example of a power supply circuit of an embodiment.

FIG. 16 illustrates a configuration example of a power supply circuit 400 of one embodiment of the present invention. The power supply circuit 400 in FIG. 16 includes a control circuit 413, a power switch 401, a power switch 402, and a voltage regulator 403.

Voltage is supplied from a power supply 416 to the power supply circuit 400. The power switches 401 and 402 each have a function of controlling input of the voltage to the voltage regulator 403.

Note that in the case where the voltage output from the power supply 416 is AC voltage, as illustrated in FIG. 16, the power switch 401 controlling input of a first potential to the voltage regulator 403 and the power switch 402 controlling input of a second potential to the voltage regulator 403 are provided in the power supply circuit 400. In the case where the voltage output from the power supply 416 is DC voltage, as illustrated in FIG. 16, the power switch 401 and the power switch 402 may be provided in the power supply circuit 400; alternatively, the second potential may be set to a ground potential, the power switch 402 may be eliminated, and the power switch 401 may be provided in the power supply circuit 400.

In one embodiment of the present invention, a transistor having high withstand voltage is used as each of the power switches 401 and 402. For example, the transistor described in Embodiment 1 can be used for the transistor.

When the oxide semiconductor film having the aforementioned oxide stack layer is used for the power switches 401 and 402, high output current can flow through the power switches 401 and 402 and the power switches 401 and 402 can each have high withstand voltage.

The use of the aforementioned transistor can achieve high-speed switching of the power switch 401 or 402, compared with the use of a field-effect transistor including silicon carbide or gallium nitride in an active layer. Consequently, power loss due to the switching can be reduced.

The voltage regulator 403 has a function of regulating voltage input from the power supply 416 through the power switches 401 and 402. Specifically, voltage regulation in the voltage regulator 403 means any one or more of conversion of AC voltage into DC voltage, change of a voltage level, smoothing of a voltage level, and the like.

Voltage regulated in the voltage regulator 403 is applied to a load 417 and the control circuit 413.

The power supply circuit 400 in FIG. 16 includes a power storage device 404, an auxiliary power supply 405, a voltage generation circuit 406, transistors 407 to 410, and capacitors 414 and 415.

The power storage device 404 has a function of temporarily storing power supplied from the voltage regulator 403. Specifically, the power storage device 404 includes a power storage portion such as a capacitor or a secondary battery that can store power with the use of voltage applied from the voltage regulator 403.

The auxiliary power supply 405 has a function of compensating for the lack of power output from the power storage device 404 for operation of the control circuit 413. A primary battery or the like can be used as the auxiliary power supply 405.

The voltage generation circuit 406 has a function of generating voltage for controlling switching of the power switches 401 and 402 with the use of voltage output from the power storage device 404 or the auxiliary power supply 405. Specifically, the voltage generation circuit 406 has a function of generating voltage for turning on the power switches 401 and 402 and a function of generating voltage for turning off the power switches 401 and 402.

A wireless signal input circuit 411 has a function of controlling the power switches 401 and 402 in accordance with switching of the transistors 407 to 410.

Specifically, the wireless signal input circuit 411 includes an input portion that converts an instruction superimposed on a wireless signal given from the outside to control the operating states of the power switches 401 and 402 into an electric signal, and a signal processor that decodes the instruction included in the electric signal and generates a signal for controlling the switching of the transistors 407 to 410 in accordance with the instruction.

The transistors 407 to 410 switch in accordance with the signal generated in the wireless signal input circuit 411. Specifically, when the transistors 408 and 410 are on, the voltage for turning on the power switches 401 and 402 that is generated in the voltage generation circuit 406 is applied to the power switches 401 and 402. When the transistors 408 and 410 are turned off in this state, the voltage for turning on the power switches 401 and 402 is continuously applied to the power switches 401 and 402. Further, when the transistors 407 and 409 are sequentially turned on, the voltage for turning off the power switches 401 and 402 that is generated in the voltage generation circuit 406 is applied to the power switches 401 and 402. When the transistors 407 and 409 are turned off in this state, the voltage for turning off the power switches 401 and 402 is continuously applied to the power switches 401 and 402.

In one embodiment of the present invention, a transistor with extremely low off-state current is used as each of the transistors 407 to 410 so that the operation states provided to the power switches 401 and 402 are maintained. With this structure, even when generation of the voltage for determining the operating states of the power switches 401 and 402 in the voltage generation circuit 406 is stopped, the operating states of the power switches 401 and 402 can be kept. Thus, the power consumption of the voltage generation circuit 406 is reduced, so that the power consumption of the power supply circuit 400 can be reduced.

Note that the transistors 407 to 410 may be provided with back gates, which are supplied with a potential, in order to control the threshold voltages of the transistors 407 to 410.

Since a transistor including a wide-gap semiconductor whose band gap is two or more times that of silicon in an active layer has extremely low off-state current, the transistor is preferably used as each of the transistors 407 to 410. For example, an oxide semiconductor or the like can be used as the wide-gap semiconductor.

Note that a highly purified oxide semiconductor (purified OS) obtained by reduction of impurities such as moisture or hydrogen which serves as an electron donor (donor) and by reduction of oxygen vacancies is an intrinsic (i-type) semiconductor or a substantially i-type semiconductor. Accordingly, with the use of a highly purified oxide semiconductor film, the off-state current of the transistor can be reduced. Consequently, the use of a transistor including a highly purified oxide semiconductor film as each of the transistors 407 to 410 reduces the power consumption of the voltage generation circuit 406, so that the effect of reducing the power consumption of the power supply circuit 400 can be increased.

A variety of experiments can prove a low off-state current of a transistor including a highly purified oxide semiconductor for a channel formation region. For example, even when an element has a channel width of $1 \times 10^6$ μm and a channel length of 10 μm, off-state current is less than or equal to the measurement limit of a semiconductor parameter analyzer, i.e., less than or equal to $1 \times 10^{-13}$ A, at voltage (drain voltage) between the source electrode and the drain electrode of from 1 V to 10 V. In this case, it has been proven that the off-state current per channel width of the transistor is lower than or equal to 100 zA/μm. For example, according to a measurement of an off-state current of a transistor having a highly purified oxide semiconductor film in a channel formation region by using a circuit in which a capacitor and the transistor are connected to each other to control the charge flowing into or from the capacitor by the transistor, a change in charge of the capacitor per unit time has proven that the off-state current is as low as several tens of yA/μm at the voltage between the source electrode and the drain electrode of the transistor of 3 V. Accordingly, the off-state current of the transistor in which the highly purified oxide semiconductor film is used as a channel formation region is considerably lower than that of a transistor in which silicon having crystallinity is used.

Among the oxide semiconductors, unlike silicon carbide or gallium nitride, an In—Ga—Zn-based oxide, an In—Sn—Zn-based oxide, or the like has an advantage of high mass productivity because a transistor with favorable electrical characteristics can be formed by sputtering or a wet process. Further, unlike silicon carbide or gallium nitride, the oxide semiconductor (the In—Ga—Zn-based oxide) can be deposited even at room temperature; thus, a transistor with favorable electrical characteristics can be formed over a glass substrate or an integrated circuit using silicon. Further, a larger substrate can be used.

Figure 17:
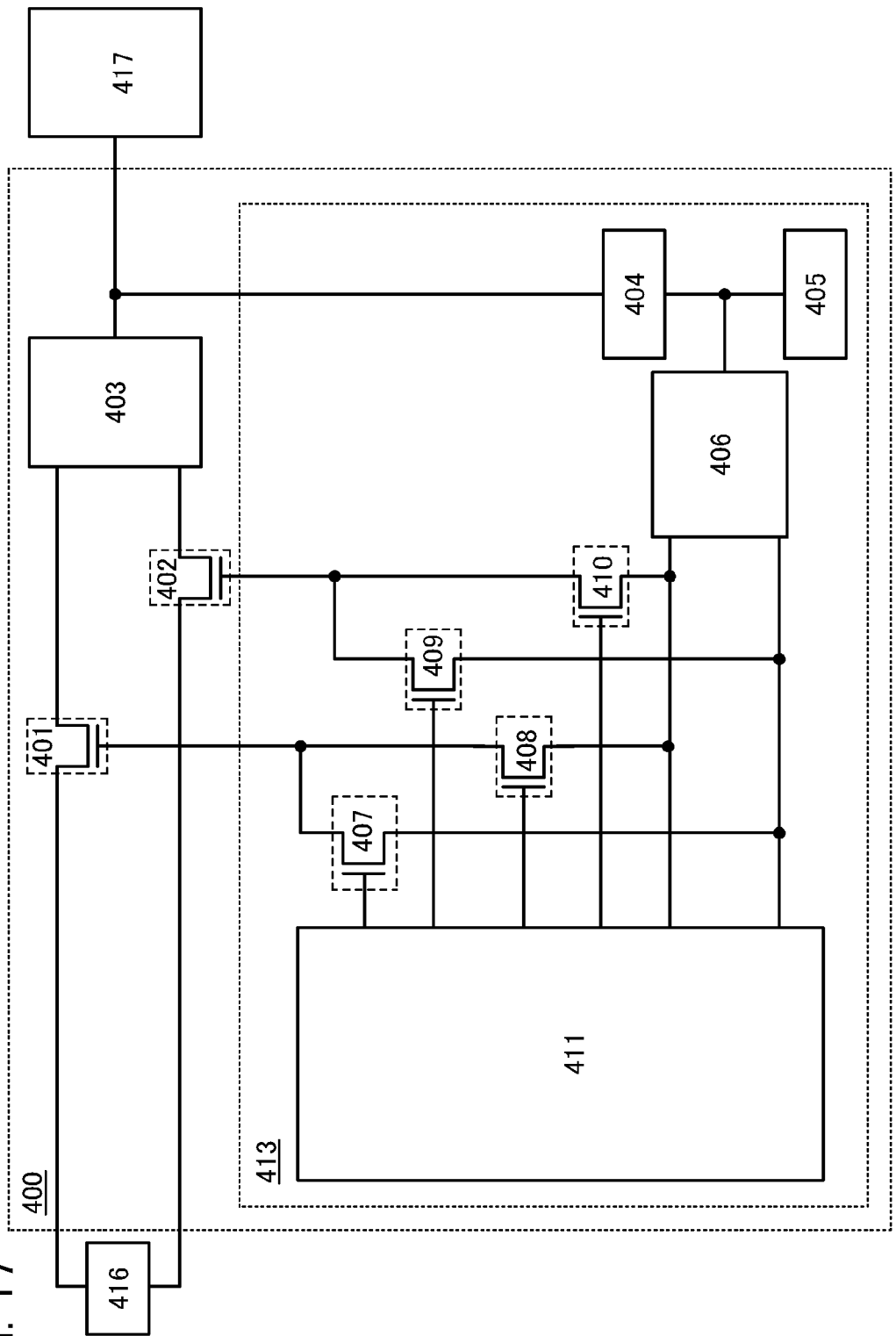
FIG. 17 is a structural example of a power supply circuit of an embodiment.

The capacitor 414 has a function of holding voltage applied to the power switch 401 when the transistors 407 and 408 are off. The capacitor 415 has a function of holding voltage applied to the power switch 402 when the transistors 409 and 410 are off. One of a pair of electrodes of each of the capacitors 414 and 415 is connected to the wireless signal input circuit 411. Note that as illustrated in FIG. 17, the capacitors 414 and 415 are not necessarily provided.

When the power switches 401 and 402 are on, voltage is supplied from the power supply 416 to the voltage regulator 403. In addition, with the voltage, power is stored in the power storage device 404.

When the power switches 401 and 402 are off, supply of voltage from the power supply 416 to the voltage regulator 403 is stopped. Thus, although power is not supplied to the power storage device 404, the control circuit 413 can be operated using power stored in the power storage device 404 or the auxiliary power supply 405 in one embodiment of the present invention, as described above. In other words, in the power supply circuit 400 according to one embodiment of the present invention, supply of voltage to the voltage regulator 403 can be stopped while the operating states of the power switches 401 and 402 are controlled by the control circuit 413. By stopping the supply of voltage to the voltage regulator 403, it is possible to prevent power consumption due to charging and discharging of the capacitance of the voltage regulator 403 when voltage is not supplied to the load 417. Consequently, the power consumption of the power supply circuit 400 can be reduced.

Embodiment 5

A semiconductor device (including a power converter circuit and a power supply circuit) of one embodiment of the present invention is suitable for controlling supply of power to a device and favorably used particularly for a device that needs large power. For example, the semiconductor device can be favorably used for a device provided with a driver portion whose driving is controlled with power of a motor or the like and a device that controls heating or cooling by power.

Electronic appliances in which the semiconductor device of one embodiment of the present invention can be used are display devices, personal computers, image reproducing devices provided with recording media (typically, devices which reproduce the content of recording media such as digital versatile discs (DVDs) and have displays for displaying the reproduced images), and the like. Further, as electronic appliances in which the semiconductor device of one embodiment of the present invention can be used, cellular phones, game machines (including portable game machines), portable information terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), vending machines, high-frequency heating apparatuses such as microwave ovens, electric rice cookers, electric washing machines, electric fans, driers, air-conditioning systems such as air conditioners, raising and lowering devices such as elevators and escalators, electric refrigerators, electric freezers, electric refrigerator-freezers, electric sewing machines, electric tools, semiconductor testing devices, and the like can be given. The semiconductor device of one embodiment of the present invention may be used for a moving object powered by an electric motor. The moving object is a motor vehicle (a motorcycle or an ordinary motor vehicle with three or more wheels), a motor-assisted bicycle including an electric bicycle, an airplane, a vessel, a rail car, or the like. Further, the semiconductor device can be used for controlling driving of industrial robots used in a variety of fields, e.g., industries of food, home electric appliances, the moving objects, steel, semiconductor devices, civil engineering, architecture, and construction.

Specific examples of these electronic appliances are illustrated in FIGS. 18A to 18D.

Figure 18A:
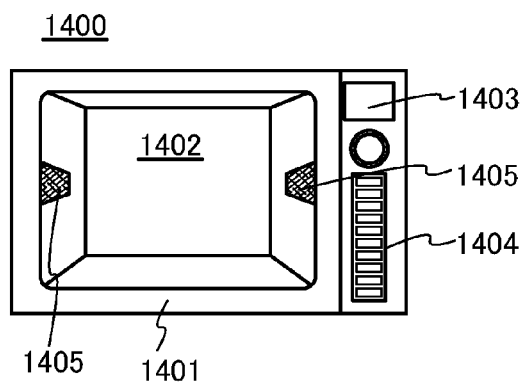
FIGS. 18A to 18D each illustrate an electronic appliance of an embodiment.

FIG. 18A illustrates a microwave oven 1400, which includes a housing 1401, a treatment room 1402 for placing an object, a display portion 1403, an input device (e.g., an operating panel) 1404, and an irradiation portion 1405 supplying an electromagnetic wave generated from a high-frequency wave generator provided in the housing 1401 to the treatment room 1402.

The semiconductor device of one embodiment of the present invention can be used, for example, in a power supply circuit that controls supply of power to the high-frequency wave generator.

Figure 18B:
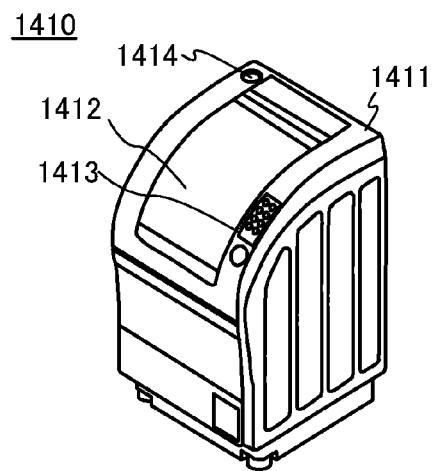

FIG. 18B illustrates a washing machine 1410, which includes a housing 1411, an open/close portion 1412 for opening or closing a washing tub provided in the housing 1411, an input device (e.g., an operating panel) 1413, and a water inlet 1414 of the washing tub.

The semiconductor device of one embodiment of the present invention can be used, for example, in a circuit that controls supply of power to a motor controlling rotation of the washing tub.

Figure 18C:
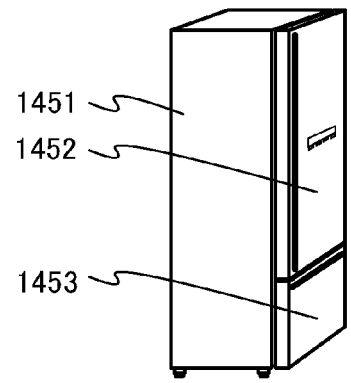

FIG. 18C is an example of an electric refrigerator-freezer. The electronic appliance illustrated in FIG. 18C includes a housing 1451, a refrigerator door 1452, and a freezer door 1453.

In the electronic appliance illustrated in FIG. 18C, the semiconductor device that is one embodiment of the present invention is provided inside the housing 1451. With this structure, supply of a power voltage to the semiconductor device in the housing 1451 can be controlled in accordance with the temperature inside the housing 1451 or in response to opening and closing of the refrigerator door 1452 and the freezer door 1453, for example.

Figure 18D:
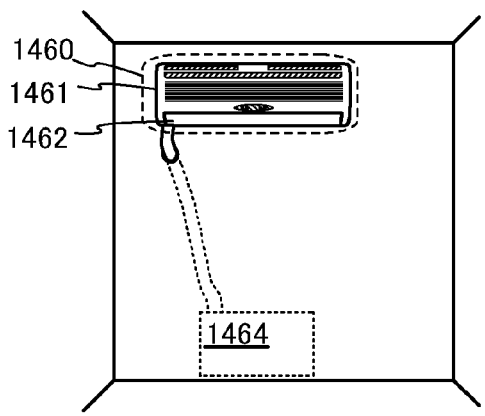

FIG. 18D illustrates an example of an air conditioner. The electronic appliance illustrated in FIG. 18D includes an indoor unit 1460 and an outdoor unit 1464.

The indoor unit 1460 includes a housing 1461 and a ventilation duct 1462.

In the electronic appliance illustrated in FIG. 18D, the semiconductor device that is one embodiment of the present invention is provided inside the housing 1461. With this structure, supply of a power supply voltage to the semiconductor device in the housing 1461 can be controlled in response to a signal from a remote controller or in accordance with the indoor temperature or humidity, for example.

The semiconductor device of one embodiment of the present invention can be used, for example, in a circuit that controls supply of power to a motor controlling rotation of a fan included in the outdoor unit 1464.

Note that the split-type air conditioner including the indoor unit and the outdoor unit is shown in FIG. 18D as an example; alternatively, an air conditioner may be such that the functions of an indoor unit and an outdoor unit are integrated in one housing.

This embodiment can be combined with any of the other embodiments disclosed in this specification as appropriate.

This application is based on Japanese Patent Application serial no. 2013-035360 filed with Japan Patent Office on Feb. 26, 2013, the entire contents of which are hereby incorporated by reference.

What is claimed is:

1. A semiconductor device comprising:
    a semiconductor layer;
    a first electrode over and in contact with the semiconductor layer, the first electrode having a closed shape and a first opening;
    a second electrode over and in contact with the semiconductor layer, the second electrode being positioned in the first opening;
    an insulating layer over the semiconductor layer, the first electrode, and the second electrode;
    a third electrode over and in contact with the insulating layer, the third electrode having a closed shape and a second opening; and
    a wiring passing the second opening and electrically connected to the second electrode,
    wherein the semiconductor layer comprises an oxide semiconductor,
    wherein the semiconductor layer comprises a first layer and a third layer, with a second layer therebetween, and
    wherein the first layer, the second layer, and the third layer satisfy the following relationship:

$EcS1, EcS3 > EcS2,$ where EcS1, EcS2, and EcS3 are energies of bottoms of conduction bands of the first layer, the second layer, and the third layer, respectively.

2. The semiconductor device according to claim 1, wherein an inner edge of the third electrode overlaps the second electrode and an outer edge of the third electrode overlaps a region between the first electrode and the second electrode.

3. The semiconductor device according to claim 1, wherein an inner edge of the third electrode overlaps a region between the first electrode and the second electrode and an outer edge of the third electrode overlaps the first electrode.

4. The semiconductor device according to claim 1, wherein the first layer, the second layer, and the third layer each comprise indium, gallium, and zinc, and wherein a proportion of indium, gallium, and zinc of the second layer is different from those of the first layer and the third layer.

5. The semiconductor device according to claim 4, wherein the proportion of indium in the second layer is larger than those in the first layer and the third layer.

6. The semiconductor device according to claim 1, wherein a corner of the first opening has an arc shape.

7. The semiconductor device according to claim 1, wherein the first opening has a circular shape.

* * * * *